(12) United States Patent
Tahara

(10) Patent No.: US 11,361,945 B2
(45) Date of Patent: Jun. 14, 2022

(54) PLASMA PROCESSING APPARATUS, PROCESSING SYSTEM, AND METHOD OF ETCHING POROUS FILM

(71) Applicant: Tokyo Electron Limited, Tokyo (JP)

(72) Inventor: Shigeru Tahara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/613,334

(22) PCT Filed: May 9, 2018

(86) PCT No.: PCT/JP2018/017959
§ 371 (c)(1),
(2) Date: Nov. 13, 2019

(87) PCT Pub. No.: WO2018/212040
PCT Pub. Date: Nov. 22, 2018

(65) Prior Publication Data
US 2020/0411293 A1 Dec. 31, 2020

(30) Foreign Application Priority Data

May 16, 2017 (JP) .............................. JP2017-097557

(51) Int. Cl.
*H01J 37/32* (2006.01)
*H01L 21/02* (2006.01)
(Continued)

(52) U.S. Cl.
CPC .. *H01J 37/32449* (2013.01); *H01J 37/32522* (2013.01); *H01J 37/32724* (2013.01);
(Continued)

(58) Field of Classification Search
CPC ......... H01L 21/02126; H01L 21/67248; H01L 21/02203; H01L 21/6831; H01L 21/67103;
(Continued)

(56) References Cited

U.S. PATENT DOCUMENTS

2004/0081607 A1* 4/2004 Hasegawa .............. B01D 53/68
423/240 R
2006/0245852 A1* 11/2006 Iwabuchi .......... H01L 21/67201
414/217

(Continued)

FOREIGN PATENT DOCUMENTS

JP 2016-207768 A 12/2016
TW 521335 B 2/2003

OTHER PUBLICATIONS

International Search Report issued in PCT/JP2018/017959; dated Jul. 31, 2018.

*Primary Examiner* — Yuechuan Yu
(74) *Attorney, Agent, or Firm* — Studebaker & Brackett PC

(57) ABSTRACT

A plasma processing apparatus of an embodiment includes a chamber body, a stage, a gas supply system, and a plasma generator. The chamber body provides an inner space thereof as a chamber. The stage is provided in the chamber. In the stage, a flow channel for a refrigerant is formed. The gas supply system is configured to supply a first gas causing capillary condensation thereof in a porous film and a second gas for etching a porous film to the chamber. The plasma generator is configured to generate plasma of a gas supplied to the chamber. The gas supply system provides a first flow passage connecting a source of the second gas to the chamber, a second flow passage connecting a source of the first gas to the first flow passage, and a third flow passage (Continued)

connecting a gas discharging apparatus to the second flow passage.

20 Claims, 15 Drawing Sheets

(51) Int. Cl.
*H01L 21/311* (2006.01)
*H01L 21/67* (2006.01)
*H01L 21/687* (2006.01)

(52) U.S. Cl.
CPC .. *H01J 37/32733* (2013.01); *H01L 21/02126* (2013.01); *H01L 21/02203* (2013.01); *H01L 21/31116* (2013.01); *H01L 21/31144* (2013.01); *H01L 21/67069* (2013.01); *H01L 21/67167* (2013.01); *H01L 21/67196* (2013.01); *H01L 21/68707* (2013.01); *H01J 2237/334* (2013.01)

(58) Field of Classification Search
CPC ......... H01L 21/67017; H01L 21/31144; H01L 21/67167; H01L 21/31116; H01L 21/67069; H01L 21/67196; H01L 21/68707; H01L 21/67109; H01L 21/67019; H01J 37/32449; H01J 37/32724; H01J 37/32522; H01J 37/32733; H01J 2237/334; H05H 1/46
See application file for complete search history.

(56) References Cited

U.S. PATENT DOCUMENTS

| 2007/0186972 | A1* | 8/2007 | Kobayashi | H01J 37/3244 137/15.01 |
| 2009/0117746 | A1* | 5/2009 | Masuda | H01L 21/67069 438/710 |
| 2020/0010630 | A1* | 1/2020 | Urabe | C08J 5/18 |

* cited by examiner

PLASMA PROCESSING APPARATUS, PROCESSING SYSTEM, AND METHOD OF ETCHING POROUS FILM

TECHNICAL FIELD

Embodiment of the present disclosure relates to a plasma processing apparatus, a processing system, and a method of etching a porous film.

BACKGROUND ART

In an electronic device such as a semiconductor device, a porous film may be used. As the porous film, for example, a film formed of a low-dielectric constant material, such as a SiOCH film is used. When manufacturing such an electronic device, a fine pattern formed in photoresist by lithography is transferred to a film such as a TiN film, a $SiO_2$ film, and a $Si_3N_4$ film by plasma etching as necessary, thereby forming a hard mask. Then, processing of transferring the pattern to a porous film is performed by plasma etching.

In plasma etching of a porous film, radical is generated by exciting an etching gas in a chamber of a plasma processing apparatus. However, the radical may penetrate into a pore of the porous film to cause damage to the porous film. Therefore, a technology of restraining radical from penetrating into a porous film is required.

Patent Literature 1 discloses a technology of restraining radical from penetrating into a porous film. In the technology disclosed in Patent Literature 1, a fluorocarbon gas such as $C_6F_6$ gas and $C_7F_8$ gas, a hydrocarbon gas, or an oxygen-containing hydrocarbon gas is liquefied in a porous film due to capillary condensation, thereby becoming liquid. Due to the liquid generated as described above, radical is restrained from penetrating into the porous film at the time of plasma etching.

CITATION LIST

Patent Literature

Patent Literature 1: Japanese Patent Application Laid-Open Publication No. 2016-207768

SUMMARY OF INVENTION

Technical Problem

When the pressure (or the partial pressure) of a gas causing capillary condensation thereof in a porous film is high, the gas is liquefied. When the pressure (or the partial pressure) of the gas is higher than the saturated vapor pressure in a flow passage of a gas supply system connected to a chamber of the plasma processing apparatus, the gas is liquefied in the flow passage. Particularly, when the flow rate of the gas is unstable in a phase of starting control of the flow rate of the gas, or when the gas remains in the flow passage of the gas supply system after a preceding step ends, the pressure (or the partial pressure) of the gas may rise unintentionally in the flow passage of the gas supply system to exceed the saturated vapor pressure. Therefore, a gas causing capillary condensation thereof in a porous film is required to be restrained from being liquefied in the flow passage of the gas supply system.

Solution to Problem

In one aspect, there is provided a plasma processing apparatus for etching a porous film. The plasma processing apparatus includes a chamber body, a stage, a gas supply system, and a plasma generator. The chamber body provides an inner space thereof as a chamber. The stage is provided in the chamber. In the stage, a flow channel for a refrigerant is formed. The gas supply system is configured to supply a first gas causing capillary condensation thereof in the porous film and a second gas for etching the porous film to the chamber. The plasma generator is configured to generate plasma of a gas supplied to the chamber. The gas supply system provides a first flow passage connecting a source of the second gas to the chamber, a second flow passage connecting a source of the first gas to the first flow passage, and a third flow passage connecting a gas discharging apparatus to the second flow passage.

According to the plasma processing apparatus of the one aspect, the first gas can be liquefied in the porous film due to capillary condensation, and while the porous film is protected by liquid in the porous film, the porous film can be etched by plasma of the second gas. In addition, according to the plasma processing apparatus, the first gas in the second flow passage can be discharged by the gas discharging apparatus. In addition, the pressure (or the partial pressure) of the first gas in the second flow passage can be adjusted by the gas discharging apparatus. Therefore, according to the plasma processing apparatus, the pressure (or the partial pressure) of the first gas is restrained from increasing in the second flow passage, and the first gas is restrained from being liquefied in the second flow passage.

In one embodiment, the gas supply system includes a control valve, a first orifice member, and a first on-off valve. The control valve is provided on the second flow passage. The first orifice member defines a terminal end of the second flow provided on a downstream side of the control valve. The first on-off valve is configured to open and close the terminal end of the second flow passage with respect to the first flow passage. The first on-off valve is provided at a connection spot between the first flow passage and the second flow passage. In the embodiment, since the length of the flow passage between the first orifice member and the first on-off valve is extremely short, a gas accumulated between the first orifice member and the first on-off valve is prevented from rapidly flowing into the first flow passage when the first on-off valve is opened. In addition, when the first on-off valve is closed, the first gas of which the flow rate is controlled by the control valve can be supplied to the second flow passage, while discharging is performed for the second flow passage. Therefore, when the first gas is supplied to the chamber, the pressure (or the partial pressure) of the first gas can shortly reach set pressure.

In one embodiment, the gas supply system may further include a second orifice member partially defining the third flow passage, and a second on-off valve provided on the third flow passage between the second orifice member and the gas discharging apparatus.

In one embodiment, the gas supply system may include a first on-off valve provided on the second flow passage, and a second on-off valve provided on the third flow passage. In the embodiment, when the first on-off valve is opened, the first gas is supplied to the chamber via the first flow passage. When the second on-off valve is opened, a gas in the second flow passage is discharged.

In one embodiment, the plasma processing apparatus further includes a heater for heating a pipe which provides the first flow passage, the second flow passage, and the third flow passage. According to the embodiment, the first gas in the first flow passage, the second flow passage, and the third flow passage can be restrained from being liquefied.

In one embodiment, the plasma processing apparatus further includes a heater for heating the chamber body. In the embodiment, the first gas is restrained from being liquefied on a wall surface defining the chamber.

In another aspect, there is provided a processing system. The processing system includes the plasma processing apparatus according to any one of the aspect and the embodiments described above, a transfer module, and a heat treatment apparatus. The transfer module provides a transfer chamber. The transfer chamber is capable of being connected to the chamber of the plasma processing apparatus and of being depressurized. The transfer module has a transfer unit for transferring a workpiece. The transfer unit is provided in the transfer chamber. The heat treatment apparatus provides an other chamber capable of being connected to the transfer chamber. The heat treatment apparatus is configured to heat a workpiece in the other chamber. According to the processing system of the aspect, after the porous film is etched in the plasma processing apparatus, liquid in the porous film can be removed by heating the workpiece in the heat treatment apparatus.

In still another aspect, there is provided a method of etching a porous film. The method uses the plasma processing apparatus according to any one of the aspect and the embodiments described above, or the processing system described above. The method is performed in a state where a workpiece is placed on a stage provided in the chamber of the plasma processing apparatus. The workpiece has the porous film and a mask. The mask is provided on the porous film and provides opening partially exposing the porous film. The method includes (i) a step of supplying the first gas to the chamber such that capillary condensation of the first gas is caused in the porous film, wherein partial pressure of the first gas in the chamber or pressure of the first gas in the chamber when only the first gas is supplied to the chamber is higher than critical pressure causing capillary condensation of the first gas in the porous film and lower than saturated vapor pressure of the first gas, and (ii) a step of generating plasma of the second gas in the chamber of the plasma processing apparatus to etch the porous film.

In one embodiment, the method further includes a step of discharging a gas in the second flow passage by using the gas discharging apparatus, before the step of supplying the first gas is performed. According to the embodiment, the first gas is restrained from being liquefied in the second flow passage. In one embodiment, when the step of discharging a gas in the second flow passage is performed, the first on-off valve is closed.

In one embodiment, the method further includes a step of discharging a gas in the second flow passage by using the gas discharging apparatus, after the step of generating plasma of the second gas is performed. According to the embodiment, the first gas is restrained from being liquefied in the second flow passage. In one embodiment, when the step of discharging a gas in the second flow passage is performed, the first on-off valve is closed.

In one embodiment, during a period of executing the step of generating plasma of the second gas, the first gas is stopped being supplied to the chamber.

In one embodiment, the step of supplying the first gas and the step of generating plasma of the second gas are alternately repeated. In the step of generating plasma of the second gas of one embodiment, the first gas is stopped being supplied to the chamber. In one embodiment, while the step of supplying the first gas and the step of generating plasma of the second gas are alternately repeated, a flow rate of the first gas is reduced gradually. According to the embodiment, when the depth of the opening formed in the porous film becomes large by etching of the porous film, the pressure (or the partial pressure) of the first gas is decreased.

In one embodiment, during the step of supplying the first gas and the step of generating plasma of the second gas, the first gas and the second gas are supplied to the chamber. In the step of generating plasma of the second gas of one embodiment, a flow rate of the second gas supplied to the chamber is increased gradually.

Advantageous Effects of Invention

As described above, gas causing capillary condensation thereof in the porous film is restrained from being liquefied in the flow passage of the gas supply system.

DESCRIPTION OF EMBODIMENTS

Figure 1:
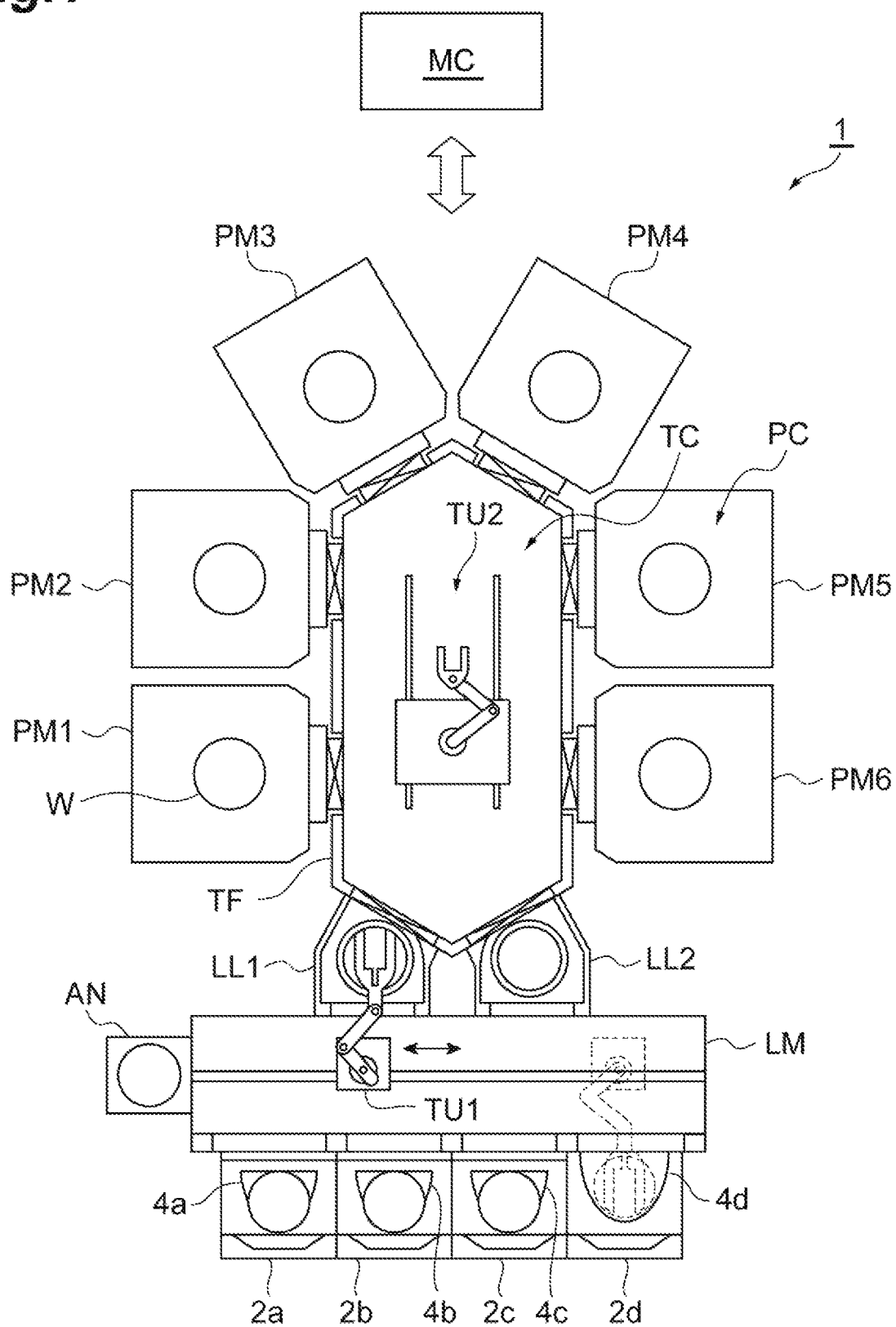
FIG. 1 is a view illustrating a processing system according to one embodiment.

Hereinafter, various embodiments will be described in detail with reference to the drawings. In the drawing, the same or equivalent portions are denoted by the same reference symbols.

Figure 2:
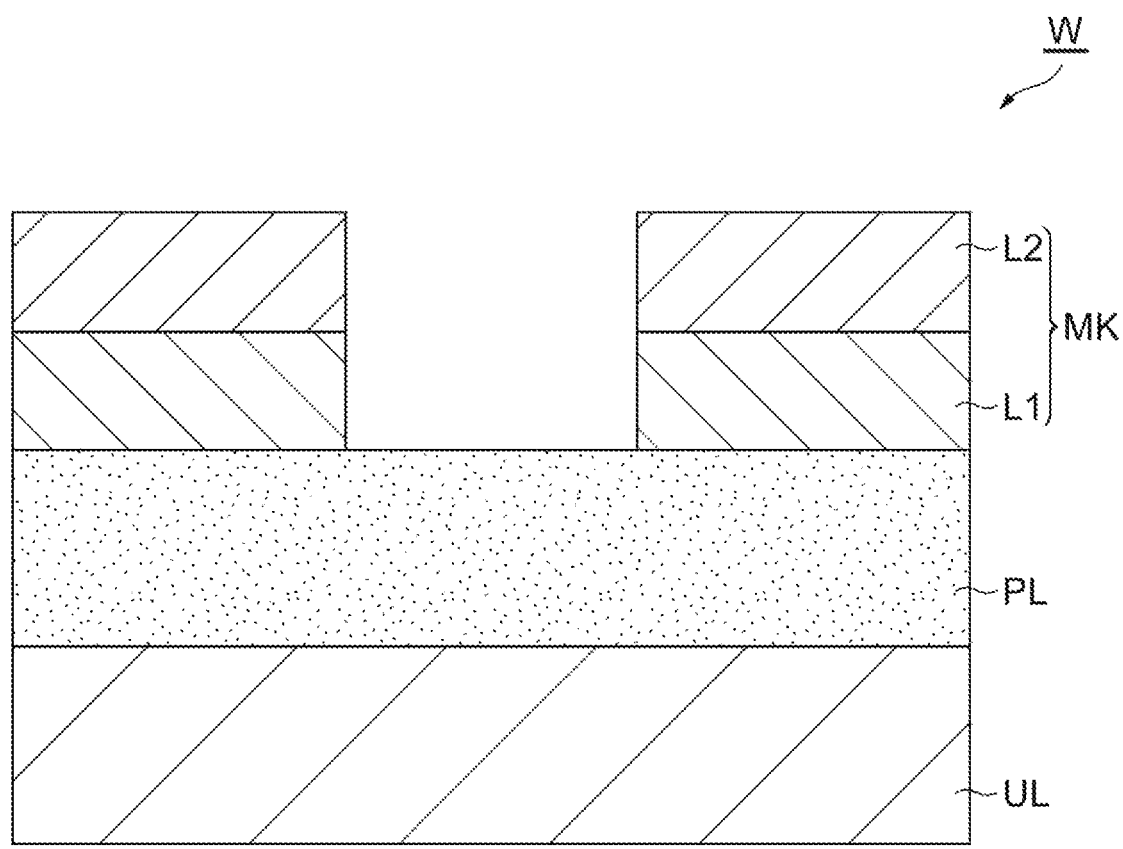
FIG. 2 is a partially enlarged cross-sectional view of an example of a workpiece.

FIG. 1 is a view illustrating a processing system according to one embodiment. A processing system 1 illustrated in FIG. 1 is a system for etching a porous film of a workpiece while protecting the porous film by liquid based on first gas. FIG. 2 is a partially enlarged cross-sectional view of an example of a workpiece. As illustrated in FIG. 2, a workpiece W includes an underlying layer UL, a porous film PL, and a mask MK. For example, the workpiece W can have a substantial disk shape.

The porous film PL is provided on the underlying layer UL. Multiple pores are fainted in the porous film PL. The pores have an average width of several nm, for example, an average width within a range from 1 nm to 2 nm. The average width is obtained from the average value of the maximum widths of the pores. The porous film PL is a film formed of a low-dielectric constant material. The porous film PL is a low-dielectric constant film. For example, the porous film PL may be a film containing silicon, oxygen, carbon, and hydrogen, that is, a SiOCH film. The porous film PL may be formed by a film forming method such as a chemical vapor growth method and a spin film forming method.

The mask MK is provided on the porous film PL. In an example, the mask MK may include a first layer L1 and a second layer L2. For example, the first layer L1 is a silicon oxide film. For example, the second layer L2 is a TIN film. The mask MK provides opening. That is, a pattern to be transferred to the porous film PL is faulted in the mask MK. The mask MK may be formed by using a lithography technology and plasma etching.

Referring to FIG. 1 again, the processing system 1 includes bases 2a to 2d, containers 4a to 4d, a loader module LM, an aligner AN, load lock modules LL1 and LL2, process modules PM1 to PM6, a transfer module TF, and a controller MC. The number of the bases, the number of the containers, the number of the load lock modules in the processing system 1 may be an arbitrary number of one or more. In addition, the number of the process modules may be an arbitrary number of two or more.

The bases 2a to 2d are arranged along one edge of the loader module LM. The containers 4a to 4d are mounted on the bases 2a to 2d, respectively. For example, each of the containers 4a to 4d is a container called a front opening unified pod (FOUP). Each of the containers 4a to 4d is configured to accommodate the workpiece W therein.

The loader module LM provides a chamber. The pressure of the chamber provided by the loader module LM is set to atmospheric pressure. A transfer unit TU1 is provided in the chamber of the loader module LM. For example, the transfer unit TU1 is an articulated robot and is controlled by the controller MC. The transfer unit TU1 is configured to transfer the workpiece W between each of the containers 4a to 4d and the aligner AN, between the aligner AN and each of the load lock modules LL1 and LL2, and between each of the load lock modules LL1 and LL2 and each of the containers 4a to 4d. The aligner AN is connected to the loader module LM. The aligner AN is configured to adjust the position (calibrate the position) of the workpiece W.

Each of the load lock module LL1 and the load lock module LL2 is provided between the loader module LM and the transfer module TF. Each of the load lock module LL1 and the load lock module LL2 provides a preliminary depressurization chamber.

The transfer module TF is connected to the load lock module LL1 and the load lock module LL2 via gate valves. The transfer module TF provides a transfer chamber TC capable of being depressurized. A transfer unit TU2 is provided in the transfer chamber TC. For example, the transfer unit TU2 is an articulated robot and is controlled by the controller MC. The transfer unit TU2 is configured to transfer the workpiece W between each of the load lock modules LL1 and LL2 and each of the process modules PM1 to PM6, and between two arbitrary process modules among the process modules PM1 to PM6.

Each of the process modules PM1 to PM6 is a processing apparatus configured to perform dedicated substrate treatment. Each of the process modules PM1 to PM6 provides a chamber. The chamber of each of the process modules PM1 to PM6 is connected to the chamber of the transfer module TF via a gate valve. One process module among the process modules PM1 to PM6 is a plasma processing apparatus. Another process module among the process modules PM1 to PM6 is a heat treatment apparatus. In the following description, the process module PMS is set as the heat treatment apparatus. As described below, the heat treatment apparatus is configured to heat the workpiece W in a chamber PC thereof after etching the porous film PL, thereby vaporizing liquid in the porous film PL and discharging a gas generated from the liquid.

The controller MC may be a computer device including a processor, a storage device such a memory, a display device such as a display, an input/output device such as a keyboard and a mouse, an input/output interface for a control signal, and a communication device. The storage device stores a control program and recipe data. The processor operates in accordance with the control program and the recipe data and transmits out the control signal to each part of the processing system 1, thereby controlling each part of the processing system 1.

Figure 3:
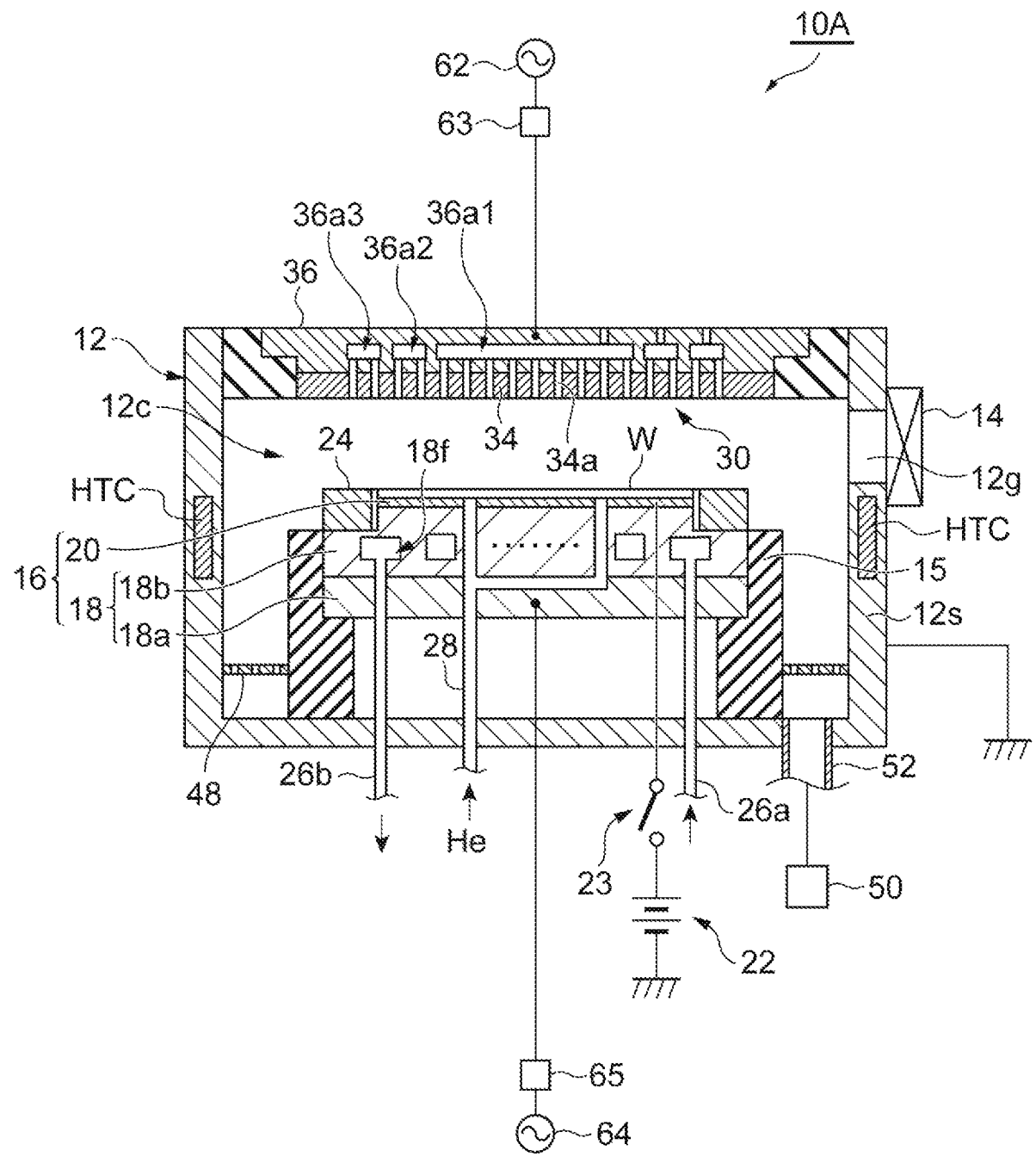
FIG. 3 is a view schematically illustrating a plasma processing apparatus according to one embodiment.

FIG. 3 is a view schematically illustrating a plasma processing apparatus according to one embodiment. FIG. 3 illustrates the plasma processing apparatus according to one embodiment in a state of being partially broken. A plasma processing apparatus 10A illustrated in FIG. 3 can be used as the plasma processing apparatus of the processing system 1. The plasma processing apparatus 10A is a capacitive coupling-type plasma etching apparatus. That is, the plasma processing apparatus 10A includes a plasma generator configured to generate capacitively coupled plasma.

The plasma processing apparatus 10A includes a chamber body 12. The chamber body 12 has a substantially cylindrical shape. The chamber body 12 provides an inner space thereof as a chamber 12c. A plasma resistant coat is formed on an inner wall surface of the chamber body 12. The coat may be an alumite film or a film formed of yttrium oxide. The chamber body 12 is grounded. Opening 12g is formed on a side wall of the chamber body 12. When the workpiece W is transferred into the chamber 12c from the outside of the chamber body 12, and when the workpiece W is transferred out of the chamber body 12 from the chamber 12c, the workpiece W passes through the opening 12g. In order to open and close the opening 12g, a gate valve 14 is attached to the side wall of the chamber body 12.

A heater HTC is provided in the chamber body 12. The heater HTC is connected to a heater power source provided outside the chamber body 12. In the example illustrated in FIG. 3, the heater HTC is provided in the side wall of the chamber body 12. However, the heater HTC may also be provided in an upper electrode 30, which will be described later. The heater HTC is configured to heat the chamber body 12 to restrain the first gas, which will be described later, from being liquefied on the wall surface defining the chamber 12c.

A support 15 is provided on the bottom portion of the chamber body 12. The support 15 has a substantially cylindrical shape. For example, the support 15 is formed of an insulating material. The support 15 extends upward from the bottom portion of the chamber body 12 inside the chamber 12c. A stage 16 is provided in the chamber 12c. The stage 16 is supported by the support 15.

The stage 16 is configured to hold the workpiece W placed thereon. The stage 16 has a lower electrode 18 and an electrostatic chuck 20. The lower electrode 18 includes a first plate 18a and a second plate 18b. For example, the first plate 18a and the second plate 18b are formed of metal such as aluminum and have substantial disk shapes. The second plate 18b is provided on the first plate 18a and is electrically connected to the first plate 18a.

The electrostatic chuck 20 is provided on the second plate 18b. The electrostatic chuck 20 has an insulating layer and a film-shaped electrode provided inside the insulating layer. A DC power source 22 is electrically connected to the electrode of the electrostatic chuck 20 via a switch 23. A DC voltage is applied to the electrode of the electrostatic chuck 20 from the DC power source 22. When the DC voltage is applied to the electrode of the electrostatic chuck 20, the electrostatic chuck 20 generates electrostatic attractive force to attract the workpiece W to the electrostatic chuck 20, thereby holding the workpiece W. A heater may be built inside the electrostatic chuck 20, and a heater power source provided outside the chamber body 12 may be connected to the heater.

A focus ring 24 is provided on a circumferential edge portion of the second plate 18b. The focus ring 24 is a substantially ring-shaped plate. The focus ring 24 is disposed to surround the edge of the workpiece W and the electrostatic chuck 20. The focus ring 24 is provided to improve uniformity of etching. For example, the focus ring 24 may be formed of a material such as silicon and quartz.

A flow channel 18f is provided in the second plate 18b. A refrigerant is supplied to the flow channel 18f via a pipe 26a from a chiller unit provided outside the chamber body 12. The refrigerant supplied to the flow channel 18f returns to the chiller unit via a pipe 26b. That is, the refrigerant circulates between the flow channel 18f and the chiller unit. The temperature of the stage 16 (or the electrostatic chuck 20) and the temperature of the workpiece W are adjusted by controlling the temperature of the refrigerant. As the refrigerant, a general refrigerant which can set the temperature of the workpiece W to a temperature of −60° C. or higher, for example, a temperature not less than −50° C. and not more than −30° C. is used. Such a refrigerant includes Galden (registered trademark), for example.

A gas supply line 28 is provided in the plasma processing apparatus 10A. The gas supply line 28 supplies heat transfer gas, for example, He gas from a heat transfer gas supply mechanism to a space between the top surface of the electrostatic chuck 20 and the back surface of the workpiece W.

The plasma processing apparatus 10A further includes the upper electrode 30. The upper electrode 30 is provided above the stage 16. The upper electrode 30 is supported by an upper portion of the chamber body 12 via a member 32. The upper electrode 30 can include an electrode plate 34 and a support 36. The bottom surface of the electrode plate 34 faces the chamber 12c. A plurality of gas outlet holes 34a are provided in the electrode plate 34. The electrode plate 34 can be formed of a material such as silicon and oxide silicon.

The support 36 detachably supports the electrode plate 34 and is formed of a conductive material such as aluminum. A gas diffusion chamber 36a1, a gas diffusion chamber 36a2, and a gas diffusion chamber 36a3 are provided inside the support 36. The gas diffusion chamber 36a1 is separated from the gas diffusion chamber 36a2 and the gas diffusion chamber 36a3 in the support 36. The gas diffusion chamber 36a1 is provided above central regions of the stage 16 and the workpiece W. The planar shape of the gas diffusion chamber 36a1 viewed in the vertical direction is a substantially circular shape. The gas diffusion chamber 36a2 is provided above a region in the middle of the central region and an edge region of the workpiece W and extends in the circumferential direction outside the gas diffusion chamber 36a1. The gas diffusion chamber 36a2 is separated from the gas diffusion chamber 36a1 and the gas diffusion chamber 36a3 in the support 36. The planar shape of the gas diffusion chamber 36a2 viewed in the vertical direction is a band shape extending between two concentric circles. The gas diffusion chamber 36a3 is provided above the edge region of the workpiece W and extends in the circumferential direction outside the gas diffusion chamber 36a2. The gas diffusion chamber 36a3 is separated from the gas diffusion chamber 36a1 and the gas diffusion chamber 36a2 in the support 36. The planar shape of the gas diffusion chamber 36a3 viewed in the vertical direction is a band shape extending between two concentric circles. The gas diffusion chamber 36a1, the gas diffusion chamber 36a2, and the gas diffusion chamber 36a3 are connected to a gas supply system, which will be described later.

A baffle member 48 is provided between the support 15 and the side wall of the chamber body 12. For example, the baffle member 48 is a plate-shaped member and may be formed by coating a surface of an aluminum base material with ceramics such as $Y_2O_3$. A plurality of holes penetrating the baffle member 48 are formed in the baffle member 48. Below the baffle member 48, a gas discharging apparatus 50 is connected to the bottom portion of the chamber body 12 via a discharge pipe 52. The gas discharging apparatus 50 has a pressure controller such as a pressure adjustment valve, and a vacuum pump such as a turbomolecular pump and can depressurize the chamber 12c to desired pressure.

The plasma processing apparatus 10A further includes a first radio frequency power source 62 and a second radio frequency power source 64. The first radio frequency power source 62 is a power source generating a first radio frequency wave (radio frequency electrical energy) for generating plasma. For example, the first radio frequency wave has a frequency within a range from 27 to 100 MHz. The first radio frequency power source 62 is connected to the upper electrode 30 via an impedance matcher 63. The impedance matcher 63 has a circuit for matching output impedance of the first radio frequency power source 62 and impedance on a load side (the upper electrode 30 side). The first radio frequency power source 62 may be connected to the lower electrode 18 via the impedance matcher 63.

The second radio frequency power source 64 is a power source generating a second radio frequency wave (radio frequency electrical energy) for attracting ion to the workpiece W. For example, the second radio frequency wave has a frequency within a range from 400 kHz to 13.56 MHz. The second radio frequency power source 64 is connected to the lower electrode 18 via an impedance matcher 65. The impedance matcher 65 has a circuit for matching output impedance of the second radio frequency power source 64 and impedance on a load side (the lower electrode 18 side).

Figure 4:
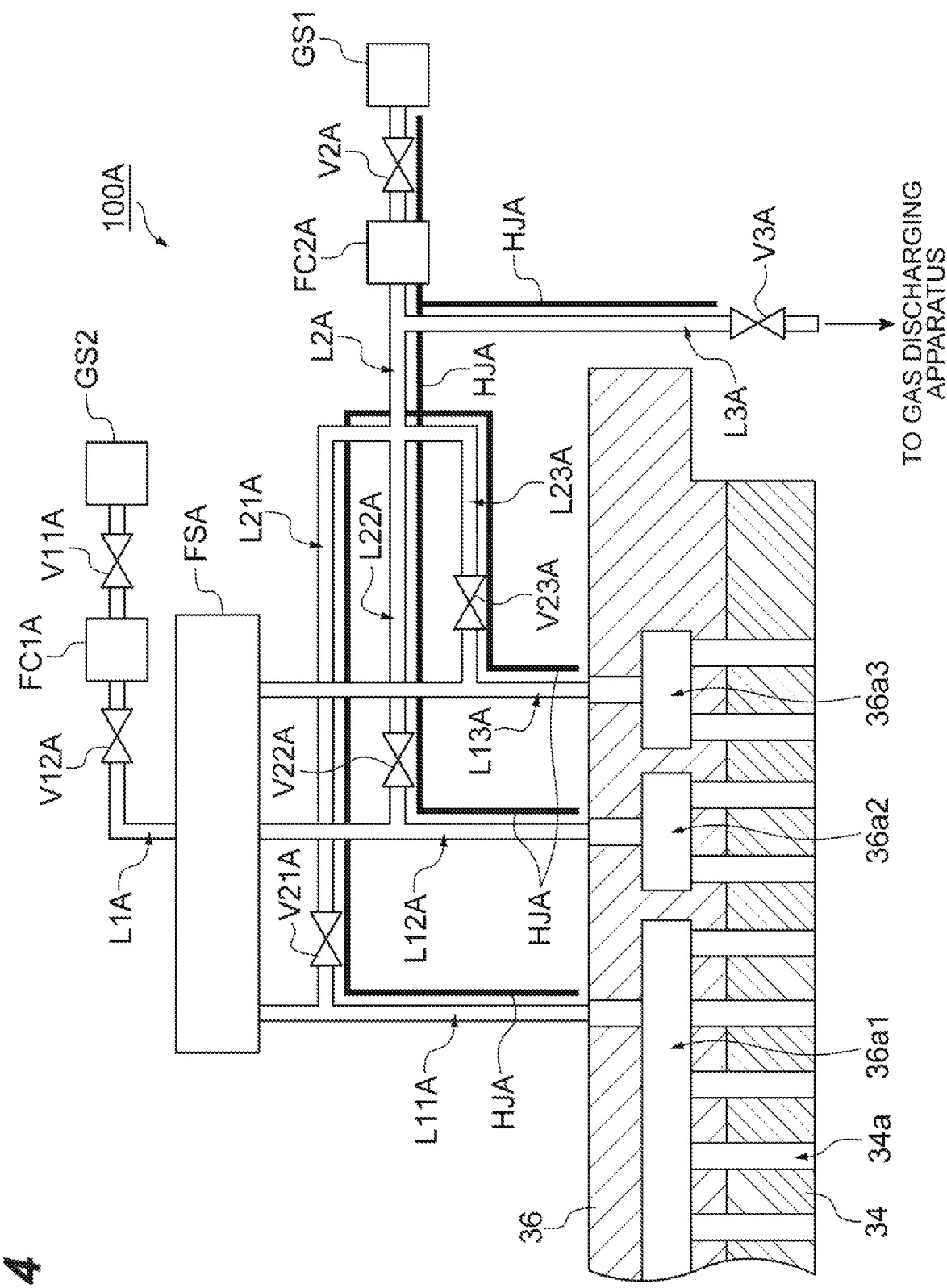
FIG. 4 is a view illustrating a first embodiment of a gas supply system of the plasma processing apparatus illustrated in FIG. 3.

FIG. 4 is a view illustrating a first embodiment of a gas supply system of the plasma processing apparatus illustrated in FIG. 3. A gas supply system 100A illustrated in FIG. 4 can be employed as the gas supply system of the plasma processing apparatus 10A. The gas supply system 100A is configured to supply the first gas and second gas to the chamber 12c.

The first gas is a gas causing capillary condensation thereof in the porous film PL. As the first gas, a $C_xF_y$ gas (a fluorocarbon gas), $C_xF_yO_z$ gas (an oxygen-containing fluorocarbon gas), $C_xH_y$ gas (a hydrocarbon gas), $C_xH_yO_z$ gas (an oxygen-containing hydrocarbon gas) or the like can be used. Here, x, y, and z are integers 1 or greater. Examples of the $C_xF_y$ gas include $C_6F_6$ gas and $C_7F_8$ gas. Examples of $C_xF_yO_z$ gas include $C_{10}F_{22}O_5$ gas. Examples of $C_xH_y$ gas or $C_xH_yO_z$ gas include benzene ($C_6H_6$), n-butanol ($CH_3(CH_2)_2CH_2OH$), 2-butoxyethanol ($CH_3(CH_2)_3OCH_2CH_2OH$), 2-ethoxyethanol ($C_2H_5OCH_2CH_2OH$), cyclohexane ($C_6H_{12}$), dioxane ($OCH_2CH_2OCH_2CH_2$), ethanol ($C_2H_5OH$), ethyl acetate ($CH_3CO_2C_2H_5$), ethylbenzene ($C_2H_5C_6H_5$), ethylcyclohexane ($C_6H_{11}C_2H_5$), methyl ethyl ketone ($C_2H_5COCH_3$), n-octane ($CH_3(CH_2)_6CH_3$), 1-propanol ($CH_3CH_2CH_2OH$), 2-propanol (($CH_3)_2CHOH$), and toluene ($C_6H_5CH_3$).

The second gas is a gas for etching the porous film PL and includes a fluorine-containing gas. The fluorine-containing gas included in the second gas can be a gas such as $NF_3$ gas (nitrogen trifluoride gas), $SiF_4$ gas, and $CF_4$ gas, or a mixed gas of these gases. The second gas may further include an inert gas such as a rare gas. For example, the rare gas can be an arbitrary rare gas such as He gas, Ne gas, Ar gas, and Kr gas. The second gas may further include an oxygen-containing gas such as $O_2$ gas.

The gas supply system 100A provides flow passages L1A, L11A, L12A, L13A, L2A, L21A, L22A, L23A, and L3A. The flow passages L1A, L11A, L12A, L13A, L2A, L21A, L22A, L23A, and L3A are provided by a pipe.

The flow passages L1A, L11A, L12A, and L13A configures a first flow passage connecting a gas source GS2 to the chamber 12c. The gas source GS2 is a source of the second gas. One end of the flow passage L1A is connected to the gas source GS2. An on-off valve V11A, an on-off valve V12A, and a flow rate controller FC1A are provided on the flow passage L1A. The flow rate controller FC1A is a massflow controller or a pressure control-type flow rate controller and is provided between the on-off valve V11A and the on-off valve V12A. The other end of the flow passage L1A is connected to a flow splitter FSA. The flow splitter FSA is configured to distribute a gas from the flow passage L1A to the flow passage L11A, the flow passage L12A, and the flow passage L13A. One end of the flow passage L11A, one end of the flow passage L12A, and one end of the flow passage L13A are connected to the flow passage L1A via the flow splitter FSA. The other end of the flow passage L11A, the other end of the flow passage L12A, and the other end of the flow passage L13A are respectively connected to the gas diffusion chamber 36a1, the gas diffusion chamber 36a2, and the gas diffusion chamber 36a3.

The flow passages L2A, L21A, L22A, and L23A configures a second flow passage connecting a gas source GS1 to the flow passage L11A, the flow passage L12A, and the flow passage L13A. The gas source GS1 is a source of the first gas. One end of the flow passage L2A is connected to the gas source GS1. An on-off valve V2A and a flow rate controller FC2A are provided on the flow passage L2A in order from the gas source GS1 side (the upstream side). The flow rate controller FC2A is a massflow controller or a pressure control-type flow rate controller. One end of the flow passage L21A, one end of the flow passage L22A, and one end of the flow passage L23A are connected to the other end of the flow passage L2A. The other end of the flow passage L21A, the other end of the flow passage L22A, and the other end of the flow passage L23A are respectively connected to the flow passage L11A, the flow passage L12A, and the flow passage L13A. An on-off valve V21A is provided on the flow passage L21A, an on-off valve V22A is provided on the flow passage L22A, and an on-off valve V23A is provided on the flow passage L23A. The on-off valves V21A, V22A, and V23A configure a first on-off valve provided on the second flow passage.

The flow passage L3A is a third flow passage connecting a gas discharging apparatus to the flow passages L2A, L21A, L22A, and L23A. One end of the flow passage L3A is connected to the flow passage L2A. An on-off valve V3A (a second on-off valve) is provided on the flow passage L3A. The other end of the flow passage L3A is connected to the gas discharging apparatus. The gas discharging apparatus may be the gas discharging apparatus 50 or may be a different gas discharging apparatus.

The gas supply system 100A includes a heater HJA. The heater HJA is configured to heat the pipe of the gas supply system 100A, specifically the pipe providing a flow passage in which the first gas flows. In more detail, the heater HJA is attached to the pipe providing the flow passage L2A, the flow passage L21A, the flow passage L22A, the flow passage L23A, the flow passage L11A from the connection spot of the flow passage L21A and the flow passage L11A to the other end thereof, the flow passage L12A from the connection spot of the flow passage L22A and the flow passage L12A to the other end thereof, the flow passage L13A from the connection spot of the flow passage L23A and the flow passage L13A to the other end thereof, and the flow passage L3A on the upstream side with respect to the on-off valve V3A. For example, the heater HJA is a heater jacket and is attached to the pipe. The heater HJA is connected to the heater power source.

In the plasma processing apparatus 10A including the gas supply system 100A, when the on-off valve V2A, the on-off valve V21A, the on-off valve V22A, and the on-off valve V23A are opened, the first gas is supplied to the chamber 12c. The first gas is liquefied due to capillary condensation and becomes liquid in the porous film PL. When the on-off valve V11A and the on-off valve V12A are opened, the second gas is supplied to the chamber 12c. When the first radio frequency wave is supplied while the second gas is supplied to the chamber 12c, plasma of the second gas is generated. The porous film PL is etched by the active species such as radical and ion from plasma of the second gas. Since the inside of the porous film PL is filled with the above-described liquid when the porous film PL is etched, the radical is restrained from penetrating into the porous film PL. As a result, damage of the porous film PL is reduced. That is, the plasma processing apparatus 10A including the gas supply system 100A can etch the porous film PL by plasma of the second gas while protecting the porous film PL by the liquid.

In addition, according to the plasma processing apparatus 10A including the gas supply system 100A, the first gas in the flow passage L2A, the flow passage L21A, the flow passage L22A, and the flow passage L23A can be discharged by the gas discharging apparatus. In addition, according to the plasma processing apparatus 10A including the gas supply system 100A, the pressure (or the partial pressure) of the first gas in the flow passage L2A, the flow passage L21A, the flow passage L22A, and the flow passage L23A can be adjusted by the gas discharging apparatus. Therefore, according to the plasma processing apparatus 10A including the gas supply system 100A, the pressure (or the partial pressure) of the first gas is restrained from increasing in the flow passage L2A, the flow passage L21A, the flow passage L22A, and the flow passage L23A. Thus, the first gas is restrained from being liquefied in the flow passage L2A, the flow passage L21A, the flow passage L22A, and the flow passage L23A.

In one embodiment, the heater HTC restrains the first gas from being liquefied on the wall surface defining the chamber 12c. In one embodiment, the heater HJA restrains the first gas from being liquefied in the flow passage in which the first gas flows.

Figure 5:
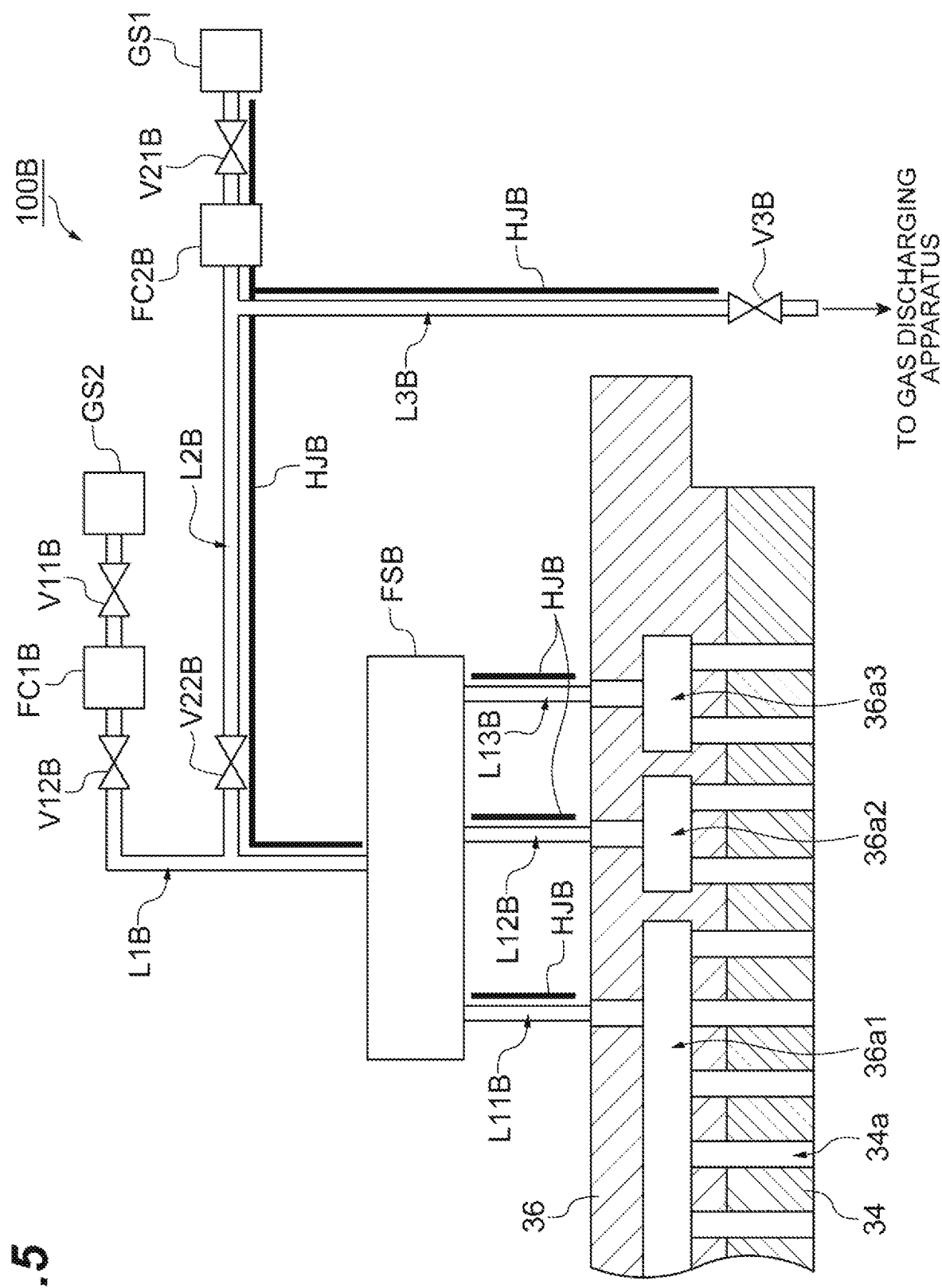
FIG. 5 is a view illustrating a second embodiment of a gas supply system of the plasma processing apparatus illustrated in FIG. 3.

FIG. 5 is a view illustrating a second embodiment of a gas supply system of the plasma processing apparatus illustrated in FIG. 3. A gas supply system 100B illustrated in FIG. 5 can be employed as the gas supply system of the plasma processing apparatus 10A. The gas supply system 100B is configured to supply the first gas and the second gas to the chamber 12c.

The gas supply system 100B provides flow passages L1B, L11B, L12B, L13B, L2B, and L3B. The flow passages L1B, L11B, L12B, L13B, L2B, and L3B are provided by a pipe.

The flow passages L1B, L11B, L12B, and L13B configures a first flow passage connecting the gas source GS2 to the chamber 12c. One end of the flow passage L1B is connected to the gas source GS2. An on-off valve V11B, an on-off valve V12B, and a flow rate controller FC1B are provided on the flow passage L1B. The flow rate controller FC1B is a massflow controller or a pressure control-type flow rate controller and is provided between the on-off valve V11B and the on-off valve V12B. The other end of the flow passage L1B is connected to a flow splitter FSB. The flow splitter FSB distributes gas from the flow passage L1B to the flow passage L11B, the flow passage L12B, and the flow passage L13B. One end of the flow passage L11B, one end of the flow passage L12B, and one end of the flow passage L13B are connected to the flow passage L1B via the flow splitter FSB. The other end of the flow passage L11B, the other end of the flow passage L12B, and the other end of the flow passage L13B are respectively connected to the gas diffusion chamber 36a1, the gas diffusion chamber 36a2, and the gas diffusion chamber 36a3.

The flow passage L2B is a second flow passage connecting the gas source GS1 to the flow passage L1B. One end of the flow passage L2B is connected to the gas source GS1. An on-off valve V21B, a flow rate controller FC2B, and an on-off valve V22B are provided on the flow passage L2B. The flow rate controller FC2B is a massflow controller or a pressure control-type flow rate controller. The other end of the flow passage L2B is connected to the flow passage L1B. The on-off valve V22B configures a first on-off valve provided on the second flow passage.

The flow passage L3B is a third flow passage connecting the gas discharging apparatus to the flow passage L2B. One end of the flow passage L3B is connected to the flow passage L2B. An on-off valve V3B (the second on-off valve) is provided on the flow passage L3B. The other end of the flow passage L3B is connected to the gas discharging apparatus. The gas discharging apparatus may be the gas discharging apparatus 50 or may be a different gas discharging apparatus.

The gas supply system 100B includes a heater HJB. The heater HJB is configured to heat the pipe of the gas supply system 100B, specifically the pipe providing a flow passage in which the first gas flows. In more detail, the heater HJB is attached to the pipe providing the flow passage L2B, the flow passage L11B, the flow passage L12B, the flow passage L13B, the flow passage L1B from the connection spot of the flow passage L2B and the flow passage L1B to the other end thereof, and the flow passage L3B on the upstream side with respect to the on-off valve V3B. For example, the heater HJB is a heater jacket and is attached to the pipe. The heater HJB is connected to the heater power source.

In the plasma processing apparatus 10A including the gas supply system 100B, when the on-off valve V21B and the on-off valve V22B are opened, the first gas is supplied to the chamber 12c. The first gas is liquefied due to capillary condensation and becomes liquid in the porous film PL. When the on-off valve V11B and the on-off valve V12B are opened, the second gas is supplied to the chamber 12c. When the first radio frequency wave is supplied while the second gas is supplied to the chamber 12c, plasma of the second gas is generated. The porous film PL is etched by the active species such as radical and ion from plasma of the second gas. Since the inside of the porous film PL is filled with the above-described liquid when the porous film PL is etched, the radical is restrained from penetrating into the porous film PL. As a result, damage of the porous film PL is reduced. That is, the plasma processing apparatus 10A including the gas supply system 100B can etch the porous film PL by plasma of the second gas while protecting the porous film PL by the liquid.

In addition, according to the plasma processing apparatus 10A including the gas supply system 100B, the first gas in the flow passage L2B can be discharged by the gas discharging apparatus. In addition, according to the plasma processing apparatus 10A including the gas supply system 100B, the pressure (or the partial pressure) of the first gas in the flow passage L2B can be adjusted by the gas discharging apparatus. Therefore, according to the plasma processing apparatus 10A including the gas supply system 100B, the pressure (or the partial pressure) of the first gas is restrained from increasing in the flow passage L2B. Thus, the first gas is restrained from being liquefied in the flow passage L2B.

In one embodiment, the heater HTC restrains the first gas from being liquefied on the wall surface defining the chamber 12c. In one embodiment, the heater HJB restrains the first gas from being liquefied in the flow passage in which the first gas flows.

Figure 6:
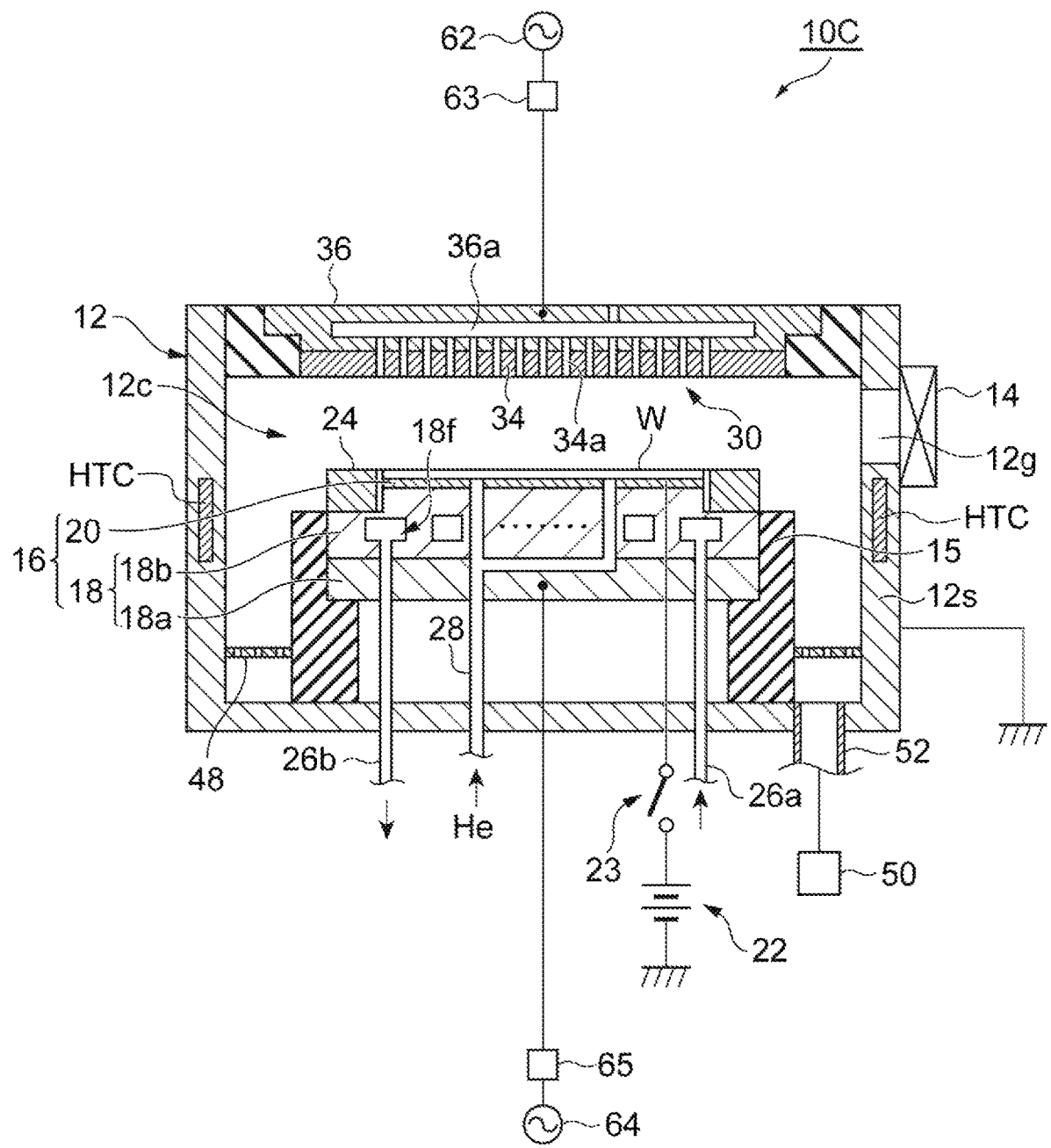
FIG. 6 is a view schematically illustrating a plasma processing apparatus according to another embodiment.

Hereinafter, a plasma processing apparatus according to another embodiment will be described. FIG. 6 is a view schematically illustrating a plasma processing apparatus according to another embodiment. FIG. 6 illustrates the plasma processing apparatus according to another embodiment in a state of being partially broken. A plasma processing apparatus 10C illustrated in FIG. 6 can be used as the plasma processing apparatus of the processing system 1. Here, in regard to the plasma processing apparatus 10C illustrated in FIG. 6, points different from the plasma processing apparatus 10A will be described and an overlapping description will be omitted. In the plasma processing apparatus 10C, one gas diffusion chamber 36a is formed in the support 36 of the upper electrode 30. Similar to the support body 36 of the plasma processing apparatus 10A, a plurality of gas diffusion chambers may be formed in the support body 36 of the plasma processing apparatus 10C.

Figure 7:
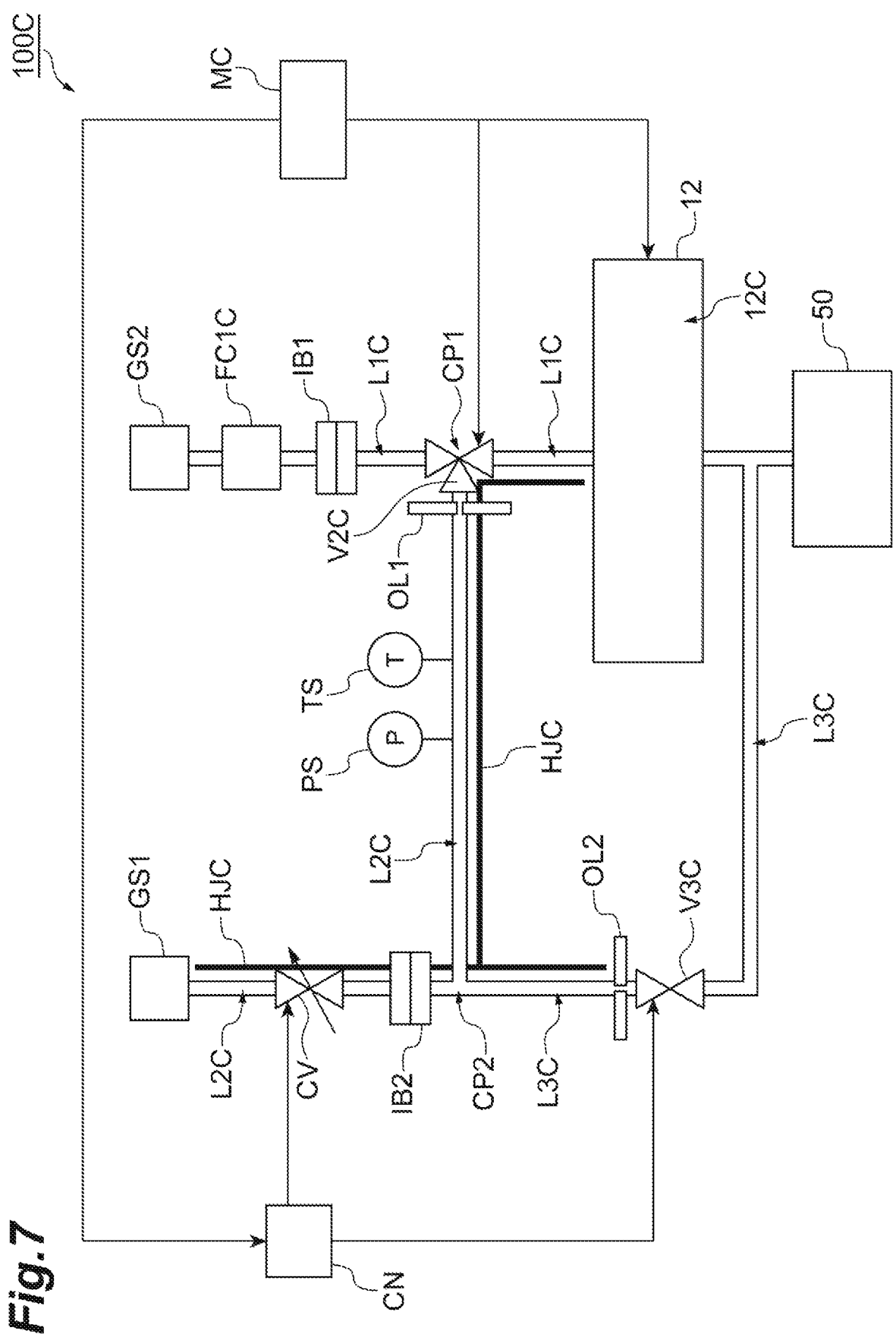
FIG. 7 is a view illustrating an embodiment of a gas supply system of the plasma processing apparatus illustrated in FIG. 6.

FIG. 7 is a view illustrating the embodiment of a gas supply system of the plasma processing apparatus illustrated in FIG. 6. The gas supply system 100C illustrated in FIG. 6 is employed as the gas supply system of the plasma processing apparatus 10C. A gas supply system 100C provides a flow passage L1C (a first flow passage), a flow passage L2C (a second flow passage), and a flow passage L3C (a third flow passage). The flow passage L1C, the flow passage L2C, and the flow passage L3C are provided by a pipe.

One end of the flow passage L1C is connected to the gas source GS2. The other end of the flow passage L1C is connected to the chamber 12c via the gas diffusion chamber 36a. One end of the flow passage L2C is connected to the gas source GS1. The other end of the flow passage L2C is connected to the flow passage L1C. One end of the flow passage L3C is connected to the flow passage L2C. The other end of the flow passage L3C is connected to the gas discharging apparatus 50 or a different gas discharging apparatus.

A flow rate controller FC1C is provided on the flow passage L1C. The flow rate controller FC1C is a massflow controller or pressure control-type flow rate controller and is provided between a connection spot CP1 of the flow passage L1C and the flow passage L2C, and the gas source GS2. Primary and secondary on-off valves may be provided on the flow passage L1C, that is, the upstream side and the downstream side of the flow rate controller FC1C. The flow rate controller FC1C is configured to control the flow rate of the second gas. Specifically, the flow rate controller FC1C adjusts the flow rate of the second gas so as to reduce an error between a target flow rate of the second gas applied from the controller MC and a measured flow rate of the second gas.

A terminal end of the flow passage L2C on the downstream side, that is, the other end of the flow passage L2C is defined by an orifice member OL1. The orifice member OL1 decreases the cross-sectional area of the flow passage L2C at the terminal end of the flow passage L2C. An on-off valve V2C (a first on-off valve) is provided at the connection spot CP1 of the flow passage L1C and the flow passage L2C. The on-off valve V2C is configured to open and close the terminal end of the flow passage L2C with respect to the flow passage L1C. The timing for opening and closing the on-off valve V2C is controlled by the controller MC. The on-off valve V2C will be described later in detail.

A control valve CV is provided on the flow passage L2C. The control valve CV is provided between a connection spot CP2 of the flow passage L2C and the flow passage L3C, and the gas source GS1. The primary on-off valve may be provided on the flow passage L2C, that is, the upstream side of the control valve CV.

The control valve CV is configured to control the flow rate of the first gas to a flow rate (a target flow rate) designated from the controller MC. A control circuit CN is connected to the control valve CV. The control circuit CN obtains the flow rate of the first gas in the flow passage L2C based on the pressure and the temperature of the flow passage L2C and adjusts the opening degree of the control valve CV so as to reduce an error between the obtained flow rate and the target flow rate. The pressure and the temperature of the flow passage L2C are sensed by a pressure sensor PS and a temperature sensor TS. The pressure sensor PS and the temperature sensor TS sense the pressure and the temperature of a portion between the control valve CV and the orifice member OL1 in the entirety of the flow passage L2C. A spot in the flow passage L2C of which the pressure and the temperature are sensed by the pressure sensor PS and the temperature sensor TS can be a spot closer to the orifice member OL1 than the control valve CV. Accordingly, the accuracy of controlling the flow rate of the first gas can be improved.

The flow passage L3C is partially defined by the orifice member OL2. The orifice member OL2 decreases the cross-sectional area of the flow passage L3C at a spot where an orifice member OL2 is provided. An on-off valve V3C (a second on-off valve) is provided on the flow passage L3C, that is, the downstream side of the orifice member OL2. The timing for opening and closing the on-off valve V3C is controlled by the controller MC.

An inlet block IB1 is provided on the flow passage L1C, that is, between the flow rate controller FC1C and the connection spot CP1. A flow passage which is a part of the flow passage L1C is formed inside the inlet block IB1. The inlet block IB1 couples the pipe on the upstream side thereof and the pipe on the downstream side thereof with each other. The inlet block IB1 is configured to separate the pipe on the upstream side thereof and the pipe on the downstream side thereof from each other, when the chamber 12c is open to atmospheric pressure. In addition, the inlet block IB2 is provided on the flow passage L2C, that is, between the control valve CV and the connection spot CP2. A flow passage which is a part of the flow passage L2C is formed inside the inlet block IB2. The inlet block IB2 couples the pipe on the upstream side thereof and the pipe on the downstream side thereof with each other. The inlet block IB2 is configured to separate the pipe on the upstream side thereof and the pipe on the downstream side thereof from each other, when the chamber 12c is open to atmospheric pressure.

The gas supply system 100C includes a heater HJC. The heater HJC is configured to heat the pipe of the gas supply system 100C, specifically the pipe providing a flow passage in which the first gas flows. In more detail, the heater HJC is attached to the pipe providing the flow passage L2C, the flow passage L1C on the downstream side with respect to the connection spot CP1, and the flow passage L3C on the upstream side with respect to the orifice member OL2. For example, the heater HJC is a heater jacket and is attached to the pipe. The heater HJC is connected to the heater power source.

Figure 8:
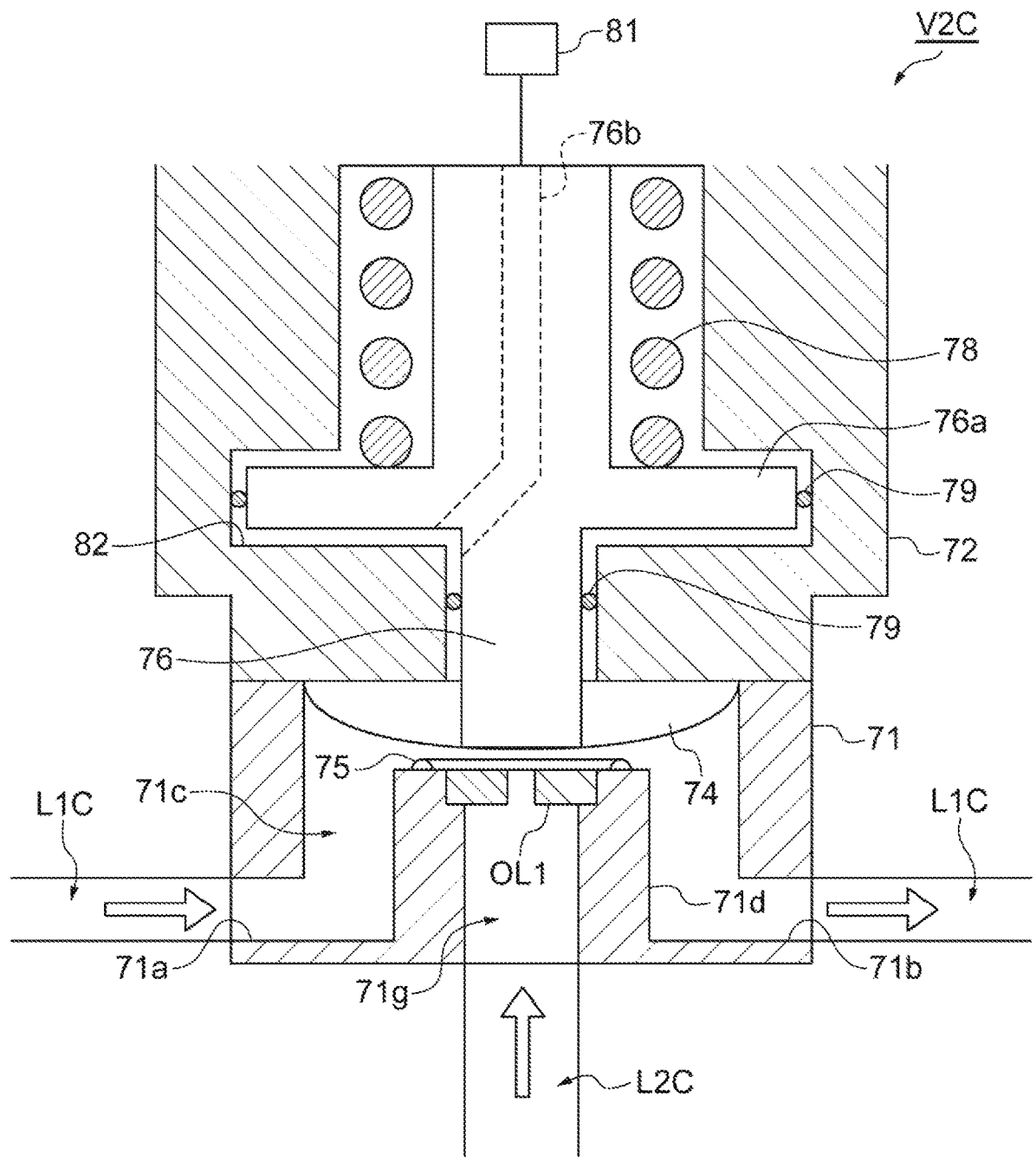
FIG. 8 is a cross-sectional view schematically illustrating an on-off valve of the gas supply system illustrated in FIG. 7.

Hereinafter, the on-off valve V2C will be described in detail. FIG. 8 is a cross-sectional view schematically illustrating an on-off valve of the gas supply system illustrated in FIG. 7. As illustrated in FIG. 8, the on-off valve V2C includes a first body portion 71 and a second body portion 72. A valve element 74 is disposed between the first body portion 71 and the second body portion 72. The second body portion 72 has a mechanism operating the valve element 74. The valve element 74 is formed of a flexible member. For example, the valve element 74 may be an elastic member, a diaphragm, or a bellows.

The first body portion 71 provides an internal flow passage 71c extending between an inlet port 71a and an outlet port 71b. The internal flow passage 71c configures a part of the flow passage L1C. The first body portion 71 further provides an internal flow passage 71g. The internal flow passage 71g configures a part of the flow passage L2C. The terminal end of the internal flow passage 71g, that is, the terminal end of the flow passage L2C is defined by the orifice member OL1. In the first body portion 71, the flow passage L1C (the internal flow passage 71c) and the flow passage L2C (the internal flow passage 71g) are capable of being connected to each other. The terminal end of the flow passage L2C is opened and closed by the valve element 74 with respect to the flow passage L1C.

In an example, the first body portion 71 has a support portion 71d. The support portion 71d protrudes from the inner wall defining the internal flow passage 71c to the second body portion 72 side (the valve element 74 side). The orifice member OL1 is supported by the tip portion of the support portion 71d on the second body portion 72 side (the valve element 74 side). The internal flow passage 71g is provided by the support portion 71d. A valve seat 75 is provided at the tip of the support portion 71d on the second body portion 72 side (the valve element 74 side). In a case where the valve element 74 comes into contact with the valve seat 75 or the orifice member OL1, the terminal end of the flow passage L2C is closed with respect to the flow passage L1C, and the connection between the flow passage L2C and the flow passage L1C is cut off. Meanwhile, in a case where the valve element 74 is separated from the valve seat 75 and the orifice member OL1, the terminal end of the flow passage L2C is opened with respect to the flow passage L1C, and the flow passage L2C communicates with the flow passage L1C.

The second body portion 72 has an element controlling the distance between the valve element 74 and the valve seat 75. In an example, the second body portion 72 has a cylinder 76, a biasing member 78, and a drive unit 81.

The cylinder 76 is a substantially rod-shaped member. The cylinder 76 is provided inside the second body portion 72 and supports the valve element 74 at the tip portion thereof (in FIG. 8, the lower end portion), for example. The cylinder 76 has a protrusion 76a. The protrusion 76a protrudes in a direction orthogonal to a direction in which the cylinder 76 extends. A flow passage 76b is formed inside the cylinder 76. Seal members 79 are respectively provided between a side surface of the protrusion 76a and the inner wall surface of the second body portion 72, and between a side surface of the cylinder 76 and the inner wall surface of the second body portion 72 below the protrusion 76a. A space 82 is defined by the inner wall surface of the second body portion 72, the side wall surface of the cylinder 76, the bottom surface of the protrusion 76a, and the seal members 79. The flow passage 76b of the cylinder 76 communicates with the space 82.

The biasing member 78 biases the cylinder 76 with respect to the valve element 74 or the orifice member OL1. The valve element 74 is pressed to the valve seat 75 or the orifice member OL1 by the biasing member 78. When the valve element 74 is pressed to the valve seat 75 or the orifice member OL1, the connection between the flow passage L1C and the flow passage L2C is cut off. The drive unit 81 is configured to move the cylinder 76 in a direction opposite to a direction in which the cylinder 76 is biased by the biasing member 78. The drive unit 81 supplies air to the flow passage 76b of the cylinder 76 and fills the space 82 with air. In a case where the pressure of air filling the space 82 is greater than the biasing force of the biasing member 78, the cylinder 76 moves the valve element 74 such that the valve element 74 is separated from the valve seat 75 and the orifice member OL1. When the valve element 74 is separated from the valve seat 75 and the orifice member OL1, the flow passage L2C communicates with the flow passage L1C.

In the plasma processing apparatus 10C including the gas supply system 100C, when the on-off valve V2C is opened, the first gas is supplied to the chamber 12c. The first gas is liquefied due to capillary condensation and becomes liquid in the porous film PL. In addition, the second gas is supplied to the chamber 12c via the flow passage L1C. When the first radio frequency wave is supplied while the second gas is supplied to the chamber 12c, plasma of the second gas is generated. The porous film PL is etched by the active species such as radical and ion from plasma of the second gas. Since the inside of the porous film PL is filled with the above-described liquid when the porous film PL is etched, the radical is restrained from penetrating into the porous film PL. As a result, damage of the porous film PL is reduced. That is, the plasma processing apparatus 10C including the gas supply system 100C can etch the porous film PL by plasma of the second gas while protecting the porous film PL by the liquid.

In addition, according to the plasma processing apparatus 10C including the gas supply system 100C, the first gas in the flow passage L2C can be discharged by the gas discharging apparatus. In addition, according to the plasma processing apparatus 10C including the gas supply system 100C, the pressure (or the partial pressure) of the first gas inside the flow passage L2C can be adjusted by the gas discharging apparatus. Therefore, according to the plasma processing apparatus 10C including the gas supply system 100C, the pressure (or the partial pressure) of the first gas is restrained from increasing in the flow passage L2C. Thus, the first gas is restrained from being liquefied in the flow passage L2C.

In one embodiment, the heater HTC restrains the first gas from being liquefied on the wall surface defining the chamber 12c. In one embodiment, the heater HJC restrains the first gas from being liquefied in the flow passage in which the first gas flows.

In addition, since the length of the flow passage between the orifice member OL1 and the on-off valve V2C is extremely short, when the on-off valve V2C is opened, gas accumulated between the orifice member OL1 and the on-off valve V2C is prevented from rapidly flowing into the flow passage L1C. In addition, when the on-off valve V2C is closed, the first gas of which the flow rate is controlled by the control valve CV can be supplied to the flow passage L2C while discharging is performed for the flow passage L2C. Therefore, when the first gas is supplied to the chamber 12c, the pressure (or the partial pressure) of the first gas can shortly reach set pressure.

Figure 9:
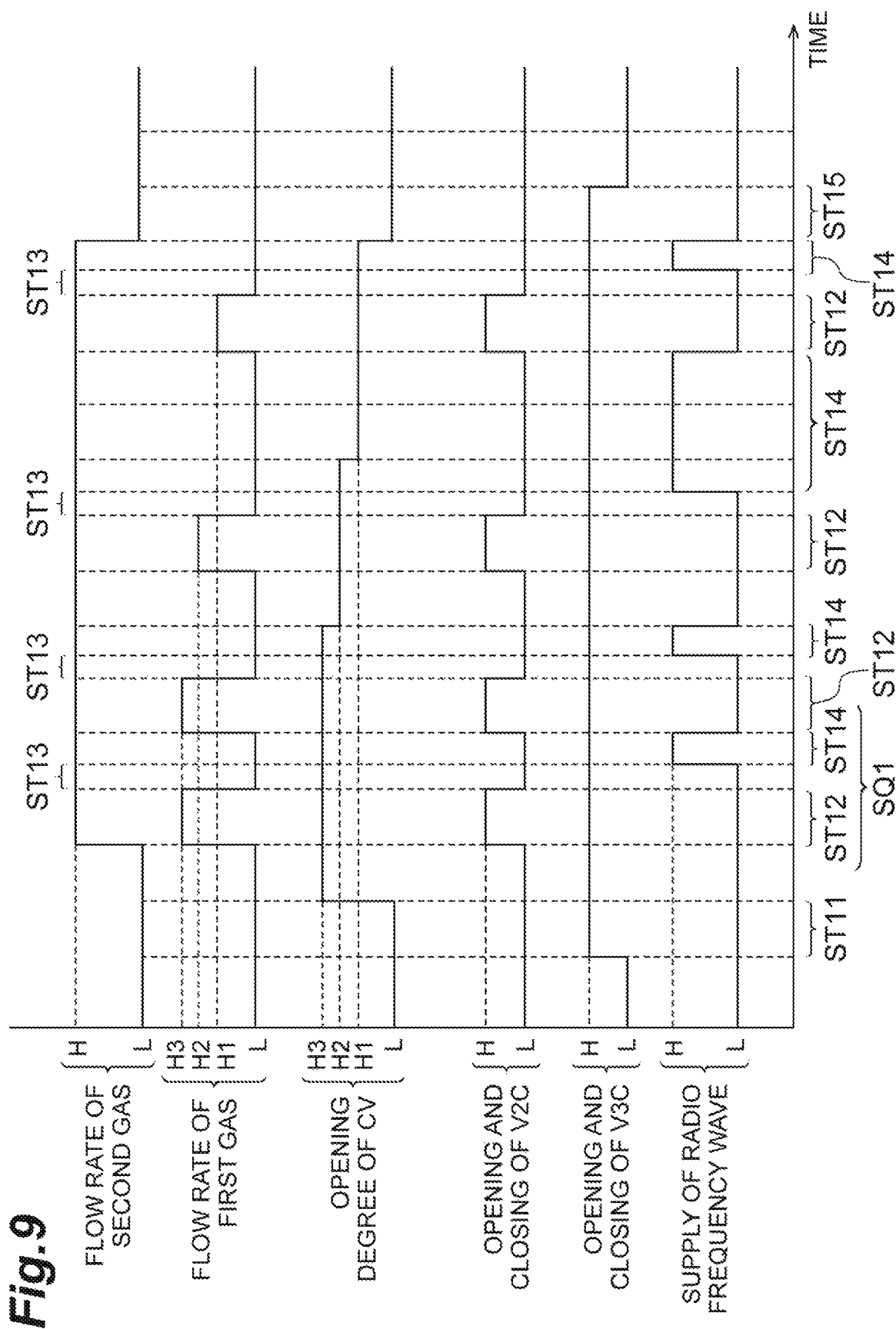
FIG. 9 is a timing chart of a method of etching a porous film according to a first embodiment.
Figure 10:
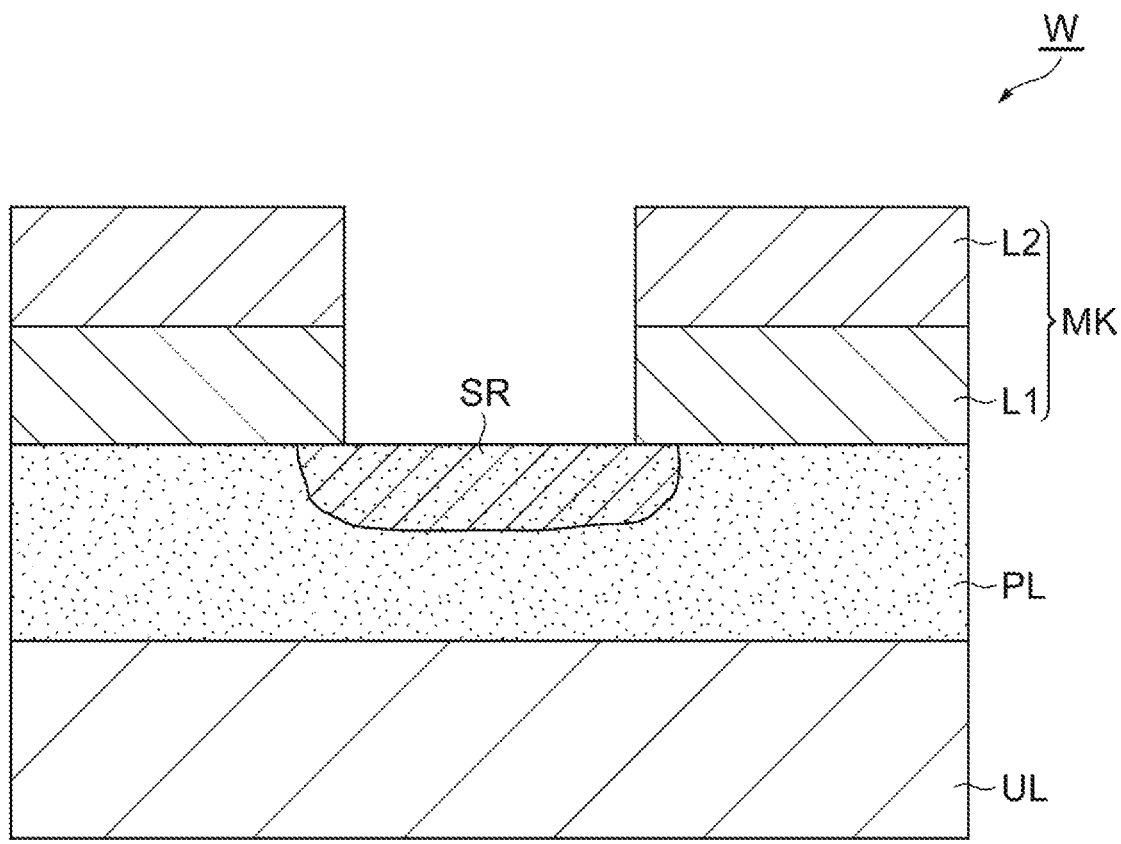
FIG. 10 is a partially enlarged cross-sectional view of a workpiece obtained during execution of the method of etching a porous film according to various embodiments.
Figure 11:
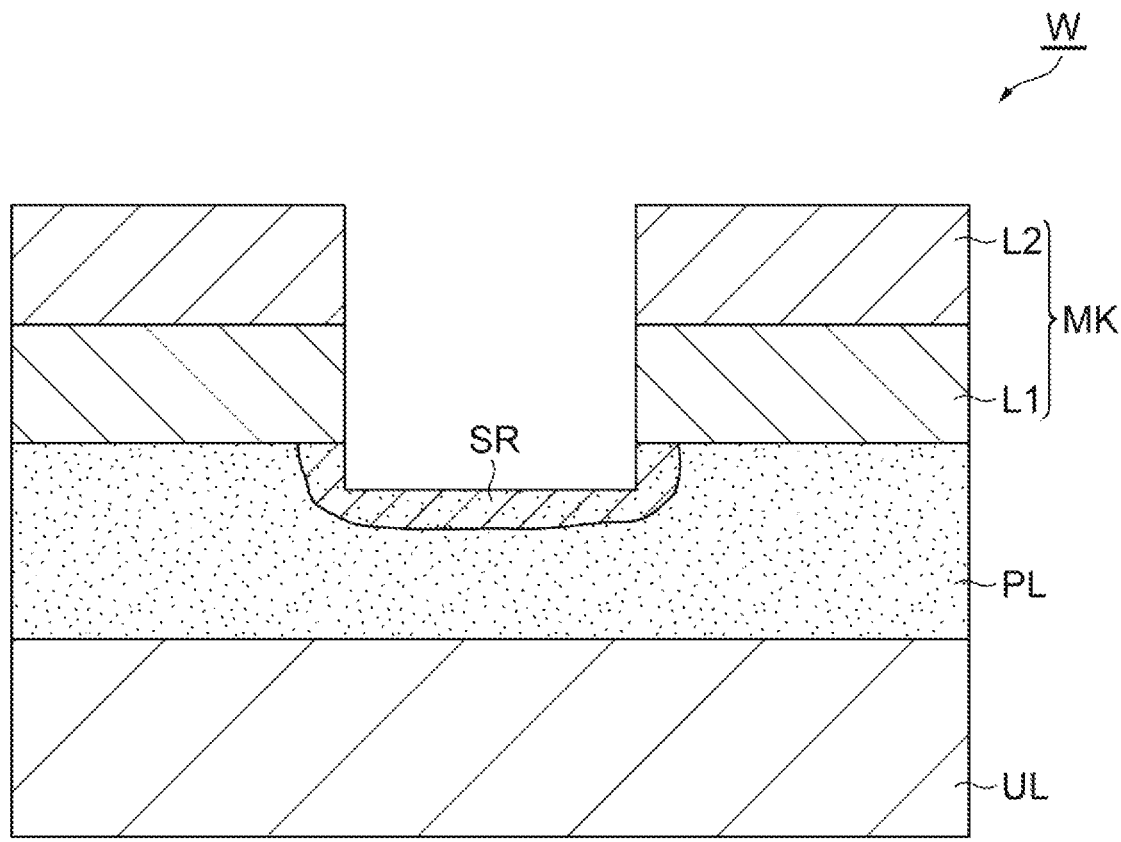
FIG. 11 is a partially enlarged cross-sectional view of a workpiece obtained during execution of the method of etching a porous film according to various embodiments.
Figure 12:
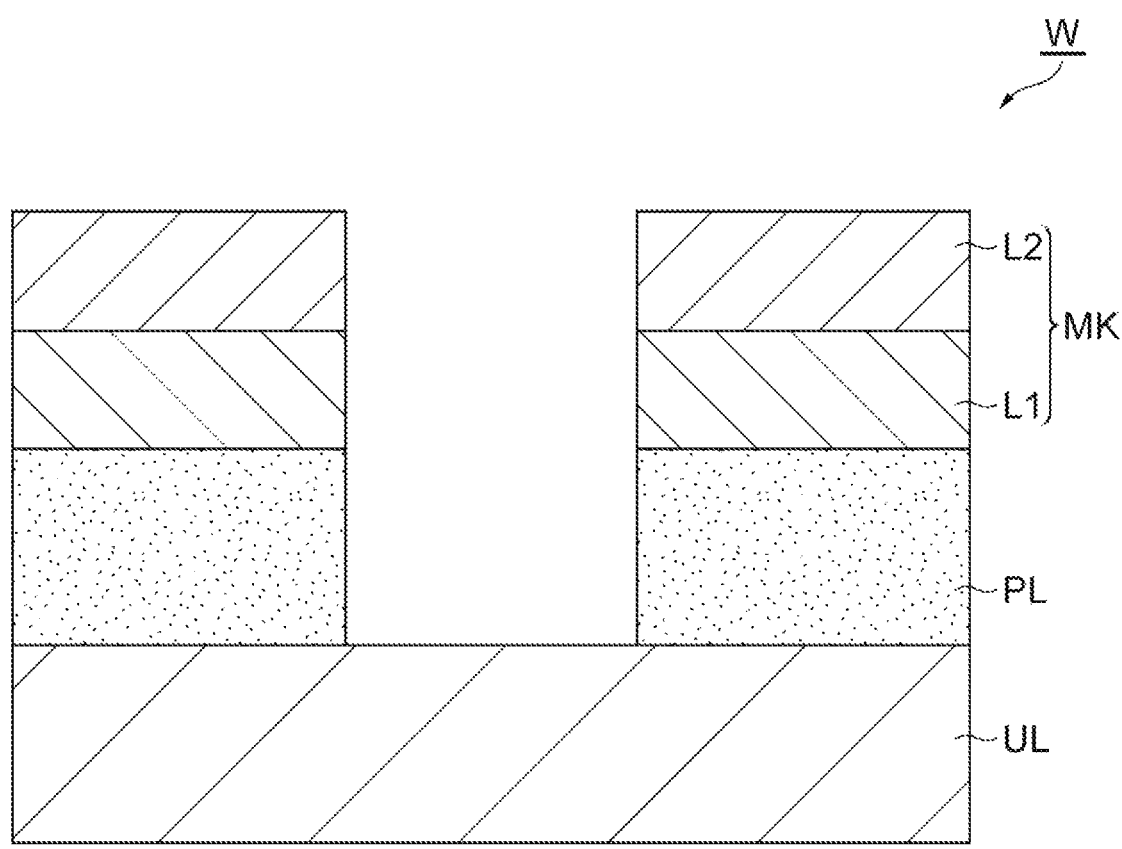
FIG. 12 is a partially enlarged cross-sectional view of a workpiece obtained by executing the method of etching a porous film according to various embodiments.

Hereinafter, several embodiments of a method of etching a porous film by using the plasma processing apparatus 10C including the gas supply system 100C will be described. FIG. 9 is a timing chart of the method of etching a porous film according to a first embodiment. In FIG. 9, the horizontal axis indicates the time. The vertical axis indicates the flow rate of the second gas, the flow rate of the first gas, the opening degree of the control valve CV, opening and closing of the on-off valve V2C, opening and closing of the on-off valve V3C, and supply of a radio frequency wave. In the timing chart related to the flow rate of the second gas in FIG. 9, the level of "H" indicates that the second gas is supplied to the chamber 12c, and the level of "L" indicates that the second gas is not supplied to the chamber 12c. In the timing chart related to the flow rate of the first gas in FIG. 9, the level of "L" indicates that the first gas is not supplied to the chamber 12c, and the levels of "H1", "H2", and "H3" indicate that the first gas is supplied to the chamber 12c. The flow rate of the first gas indicated by "H3" is greater than the flow rate of the first gas indicated by "H2", and the flow rate of the first gas indicated by "H2" is greater than the flow rate of the first gas indicated by "H1". In the timing chart related to the opening degree of the control valve CV in FIG. 9, the level of "L" indicates that the control valve CV is closed, and the levels of "H1", "H2", and "H3" indicate that the control valve CV is opened. The opening degree of the control valve CV indicated by "H3" is greater than the opening degree of the control valve CV indicated by "H2", and the opening degree of the control valve CV indicated by "H2" is greater than the opening degree of the control valve CV indicated by "H1". In the timing chart related to opening and closing of the on-off valve V2C in FIG. 9, the level of "H" indicates that the on-off valve V2C is opened, and the level of "L" indicates that the on-off valve V2C is closed. In the timing chart related to opening and closing of the on-off valve V3C in FIG. 9, the level of "H" indicates that the on-off valve V3C is opened, and the level of "L" indicates that the on-off valve V3C is closed. In the timing chart related to supply of a radio frequency wave in FIG. 9, the level of "H" indicates that the first radio frequency wave and the second radio frequency wave are supplied, and the level of "L" indicates that the first radio frequency wave and the second radio frequency wave are stopped being supplied. The following description will be given with reference to FIGS. 10 to 12, in addition to FIG. 9. FIGS. 10 and 11 are partially enlarged cross-sectional views of a workpiece obtained during execution of the method of etching a porous film according to various embodiments. FIG. 12 is a partially enlarged cross-sectional view of a workpiece obtained by executing the method of etching a porous film according to various embodiments.

A method of the first embodiment illustrated in FIG. 9 is performed in a state where the workpiece W is placed on the stage 16 in the chamber 12c. A workpiece to which the method of the first embodiment and methods of second to fourth embodiments (will be described later) are applied may be an arbitrary workpiece having a porous film.

In the method of the first embodiment, in Step ST11, a gas in the flow passage L2C is discharged. During execution of Step ST11, the control valve CV and the on-off valve V2C are closed, and the on-off valve V3C is opened. Accordingly, the flow passage L2C is connected to the gas discharging apparatus via the flow passage L3C, and a gas in the flow passage L2C is discharged by the gas discharging apparatus. The on-off valve V3C is continuously opened from the start time point of execution of Step ST11 to the end time point of execution of Step ST15, which will be described later.

In the method of the first embodiment, after execution of Step ST11 and before execution of Step ST12, the control valve CV is opened. The control valve CV is opened until the start time point of execution of Step ST15.

In the succeeding Step ST12, the first gas is supplied to the chamber 12c such that capillary condensation thereof is caused in the porous film PL. In Step ST12, the on-off valve V2C is opened. Accordingly, the first gas is supplied to the chamber 12c via the flow passage L2C and the flow passage L1C. In the method of the first embodiment, the second gas is continuously supplied to the chamber 12c from the start time point of initial execution of Step ST12 to the start time point of Step ST15. That is, in Step ST12, a mixed gas of the first gas and the second gas is supplied to the chamber 12c.

In Step ST12, the temperature of the workpiece W and the partial pressure of the first gas are set such that capillary condensation of the first gas is caused in the porous film PL. The temperature of the workpiece W is adjusted by the refrigerant supplied to the stage 16. The temperature of the workpiece W is set to a temperature which is lower than a normal temperature (25° C.) and is equal to or higher than a lower limit temperature, for example, −60° C. that can be set in accordance with the above-described refrigerant. For example, the temperature of the workpiece W is set to a temperature not less than −50° C. and not more than −30° C. At the temperature of the workpiece W, the partial pressure of the first gas is set to be higher than critical pressure causing capillary condensation of the first gas in the porous film PL and to be partial pressure lower than saturated vapor pressure of the first gas.

In Step ST12, capillary condensation of the first gas is caused in the porous film PL, and the first gas is liquefied in the porous film PL. As a result, as illustrated in FIG. 10, a region SR is formed in the porous film PL. Within the region SR, the pores of the porous film PL are filled with liquid generated from the first gas.

As illustrated in FIG. 9, in Step ST13 succeeding Step ST12, the on-off valve V2C is closed. The on-off valve V2C is continuously closed during a period from the start time point of Step ST13 to the end time point of the succeeding Step ST14. In accordance with execution of Step ST13, in regard to the gas inside the chamber 12c, the second gas replaces the mixed gas of the first gas and the second gas. In Step ST13, the pressure of the chamber 12c is set to predetermined pressure. The predetermined pressure is pressure same as the pressure of the chamber 12c during execution of Step ST14. In addition, in Step ST13, the temperature of the workpiece W is set to a temperature same as the temperature of the workpiece W during execution of Step ST14, for example, a temperature not less than −50° C. and not more than −30° C. The temperature of the workpiece W is adjusted by the refrigerant supplied to the stage 16.

In the succeeding Step ST14, plasma of the second gas is generated in the chamber 12c. During execution of Step ST14, the first gas is stopped being supplied to the chamber 12c. In Step ST14, the first radio frequency wave is supplied to the upper electrode 30 (or the lower electrode 18), and the second radio frequency wave is supplied to the lower electrode 18. One of the first radio frequency wave and the second radio frequency wave does not have to be supplied. In Step ST14, the pressure of the chamber 12c is set to predetermined pressure. For example, the predetermined pressure is pressure of 300 mTorr (40 Pa) or lower. The predetermined pressure may be pressure of 100 mTorr (13.33 Pa) or lower. In Step ST14, for example, the temperature of the workpiece W is set to a temperature not less than −50° C. and not more than −30° C. The temperature of the workpiece W is adjusted by the refrigerant supplied to the stage 16. In Step ST14, since a heat input with respect to the workpiece W is caused from plasma, the temperature of the workpiece W becomes slightly higher than the temperature of the stage 16.

In Step ST14, the porous film PL is etched due to the active species, for example, radical. Accordingly, as illustrated in FIG. 11, the porous film PL is etched in a portion exposed from the mask MK. As illustrated in FIG. 11, in Step ST14, the porous film PL is etched within the region SR from the surface thereof. Since the inside of the porous film PL is filled with liquid during execution of Step ST14, the radical is restrained from penetrating into the porous film PL.

As illustrated in FIG. 9, a sequence SQ1 including Steps ST12 to ST14 may be executed a plurality of times. That is, Step ST12 and Step ST14 may be alternately repeated.

In the method of the first embodiment, after Steps ST12 to ST14 are repeated, Step ST15 is executed. In Step ST15, a gas in the flow passage L2C is discharged. During execution of Step ST15, the control valve CV and the on-off valve V2C are closed, and the on-off valve V3C is opened. Accordingly, the flow passage L2C is connected to the gas discharging apparatus via the flow passage L3C, and the gas in the flow passage L2C is discharged by the gas discharging apparatus. In the method of the first embodiment, subsequently, the workpiece W is heated by the heat treatment apparatus. Accordingly, the liquid in the porous film PL is vaporized, and the generated gas is discharged. After the method is executed, as illustrated in FIG. 12, the opening reaching the underlying layer UL is formed in the porous film PL.

In the method of the first embodiment, as illustrated in FIG. 9, while Steps ST12 to ST14 are repeated, the opening degree of the control valve CV is reduced gradually. Accordingly, during repetition of Steps ST12 to ST14, the flow rate of the first gas is reduced gradually. Therefore, when the depth of the opening formed in the porous film becomes large by etching of the porous film PL, the partial pressure of the first gas is decreased.

According to the method of the first embodiment, the porous film PL can be etched while the porous film PL is protected by the liquid based on the first gas. In addition, in accordance with execution of Steps ST11 and ST15, the first gas is restrained from being liquefied inside the flow passage L2C. Moreover, during repetition of Steps ST12 to ST14, the pressure of the first gas in the flow passage L2C is adjusted by the gas discharging apparatus. Accordingly, the first gas is restrained from being liquefied in the flow passage L2C.

Figure 13:
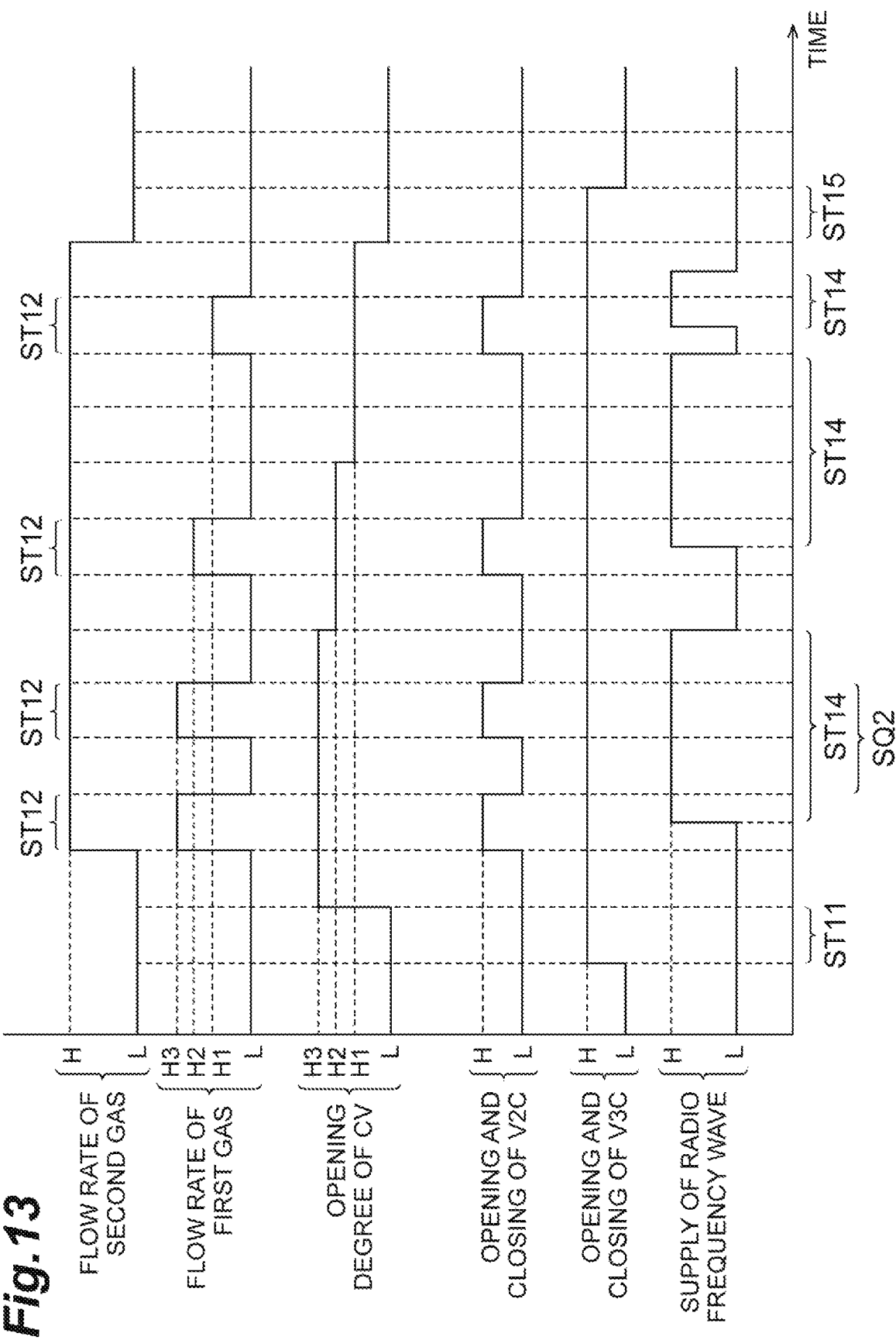
FIG. 13 is a timing chart of a method of etching a porous film according to a second embodiment.

Hereinafter, a method of etching a porous film of the second embodiment will be described. FIG. 13 is a timing chart of the method of etching a porous film according to the second embodiment. As illustrated in FIG. 13, the method of the second embodiment is different from the method of the first embodiment in regard to the timing of supplying a radio frequency wave.

In the method of the second embodiment, the start time point of Step ST14 is a time point between the start time point and the end time point of the execution period of Step ST12. Step ST14 continues from the start time point thereof to the end time point of the execution period of a plurality of Steps ST12, or the time point after the execution period of one Step ST12 ends. During execution of Step ST14, the first radio frequency wave is supplied to the upper electrode 30 (or the lower electrode 18), and the second radio frequency wave is supplied to the lower electrode 18. One of the first radio frequency wave and the second radio frequency wave does not have to be supplied. In addition, as illustrated in FIG. 13, a sequence SQ2 including Steps ST12 and ST14 may be repeated.

Figure 14:
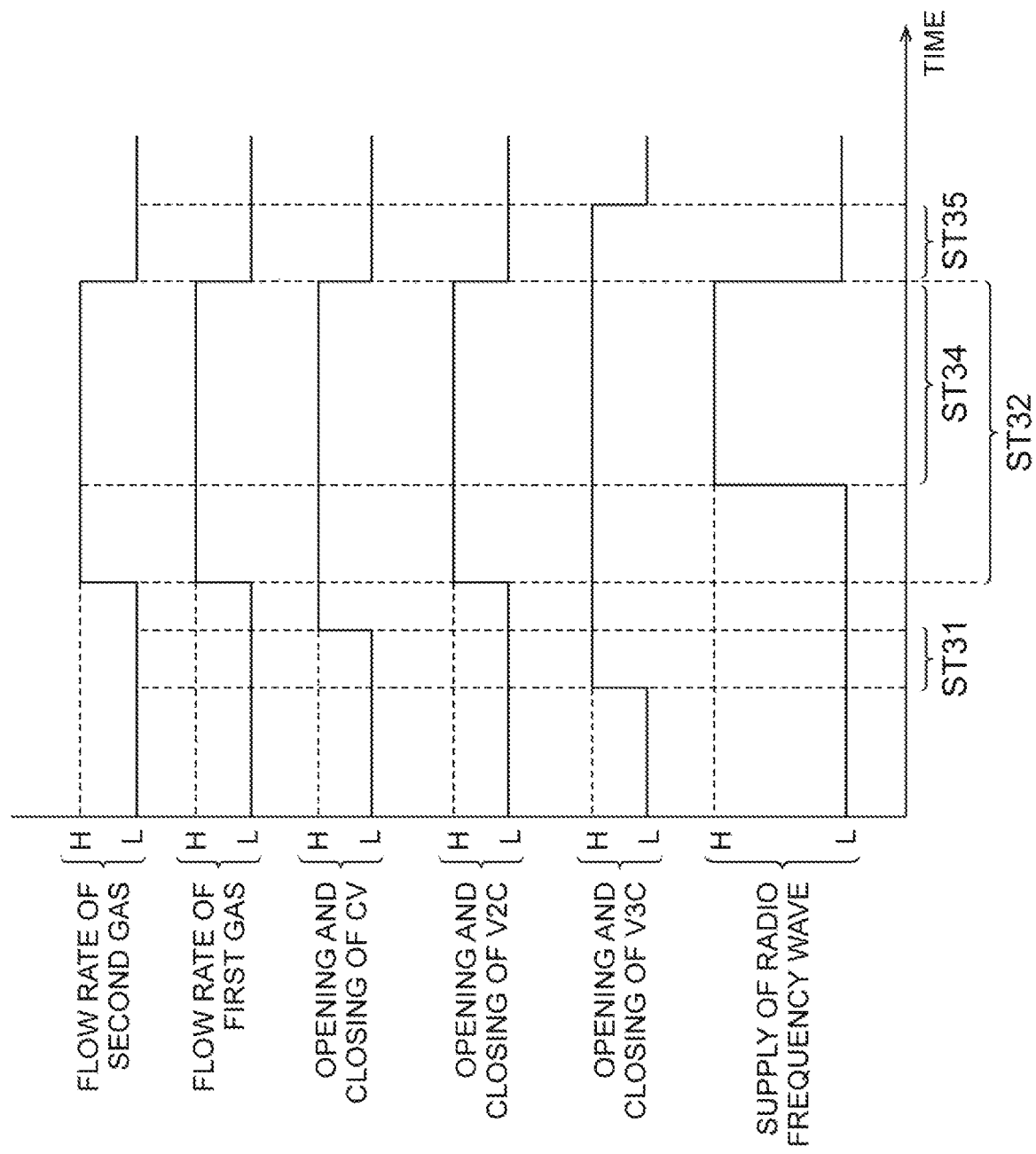
FIG. 14 is a timing chart of a method of etching a porous film according to a third embodiment.

Hereinafter, a method of etching a porous film of the third embodiment will be described. FIG. 14 is a timing chart of the method of etching a porous film according to the third embodiment. In FIG. 14, the horizontal axis indicates the time. The vertical axis indicates the flow rate of the second gas, the flow rate of the first gas, opening and closing of the control valve CV, opening and closing of the on-off valve V2C, opening and closing of the on-off valve V3C, and supply of a radio frequency wave. In the timing chart related to the flow rate of the second gas in FIG. 14, the level of "H" indicates that the second gas is supplied to the chamber 12c, and the level of "L" indicates that the second gas is not supplied to the chamber 12c. In the timing chart related to the flow rate of the first gas in FIG. 14, the level of "L" indicates that the first gas is not supplied to the chamber 12c, and the level of "H" indicates that the first gas is supplied to the chamber 12c. In the timing chart related to opening and closing of the control valve CV in FIG. 14, the level of "L" indicates that the control valve CV is closed, and the level of "H" indicates that the control valve CV is opened. In the timing chart related to opening and closing of the on-off valve V2C in FIG. 14, the level of "H" indicates that the on-off valve V2C is opened, and the level of "L" indicates that the on-off valve V2C is closed. In the timing chart related to opening and closing of the on-off valve V3C in FIG. 14, the level of "H" indicates that the on-off valve V3C is opened, and the level of "L" indicates that the on-off valve V3C is closed. In the timing chart related to supply of a radio frequency wave in FIG. 14, the level of "H" indicates that the first radio frequency wave and the second radio frequency wave are supplied, and the level of "L" indicates that the first radio frequency wave and the second radio frequency wave are stopped being supplied.

In the method of the third embodiment, in Step ST31, a gas in the flow passage L2C is discharged. During execution of Step ST31, the control valve CV and the on-off valve V2C are closed, and the on-off valve V3C is opened. Accordingly, the flow passage L2C is connected to the gas discharging apparatus via the flow passage L3C, and the gas in the flow passage L2C is discharged by the gas discharging apparatus. The on-off valve V3C is continuously opened from the start time point of execution of Step ST31 to the end time point of execution of Step ST35, which will be described later.

In the method of the third embodiment, after execution of Step ST31 and before execution of Step ST32, the control valve CV is opened. The control valve CV is opened until the start time point of execution of Step ST35.

In the succeeding Step ST32, the first gas is supplied to the chamber 12c such that capillary condensation thereof is caused in the porous film PL. In Step ST32, the on-off valve V2C is opened. Accordingly, the first gas is supplied to the chamber 12c via the flow passage L2C and the flow passage L1C. In the method of the third embodiment, the second gas is continuously supplied to the chamber 12c from the start time point of Step ST32 to the start time point of Step ST35. That is, throughout Steps ST32 and ST34, a mixed gas of the first gas and the second gas is supplied to the chamber 12c. In Step ST32, the temperature of the workpiece W and the partial pressure of the first gas are set to the temperature and the partial pressure same as the temperature of the workpiece W and the partial pressure of the first gas in Step ST12.

In Step ST34, plasma of the second gas (plasma of the above-described mixed gas) is generated. Step ST34 starts from the time point between the start time point and the end time point of the execution period of Step ST32 and continues until the end time point of Step ST32. In Step ST34, the first radio frequency wave is supplied to the upper electrode 30 (or the lower electrode 18), and the second radio frequency wave is supplied to the lower electrode 18. One of the first radio frequency wave and the second radio frequency wave does not have to be supplied. In Step ST34, the pressure of the chamber 12c and the temperature of the workpiece W are set to the temperature and the partial pressure same as the pressure of the chamber 12c and the temperature of the workpiece W in Step ST14.

In the succeeding Step ST35, a gas in the flow passage L2C is discharged. During execution of Step ST35, the control valve CV and the on-off valve V2C are closed, and the on-off valve V3C is opened. In the method of the third embodiment, subsequently, the workpiece W is heated by the heat treatment apparatus. Accordingly, the liquid in the porous film PL is vaporized, and the generated gas is discharged. In the method of the third embodiment, in Step ST32, liquid is generated in the porous film PL. In addition, even while the porous film PL is etched in Step ST34, the liquid based on the first gas is supplemented to the porous film PL. Therefore, according to the method of the third embodiment, the porous film PL can be etched while the porous film PL is protected by the liquid based on the first gas. In addition, in accordance with execution of Steps ST31 and ST35, the first gas is restrained from being liquefied in the flow passage L2C. Moreover, during execution of Steps ST32 and ST34, the pressure of the first gas in the flow passage L2C is adjusted by the gas discharging apparatus. Accordingly, the first gas is restrained from being liquefied in the flow passage L2C.

Figure 15:
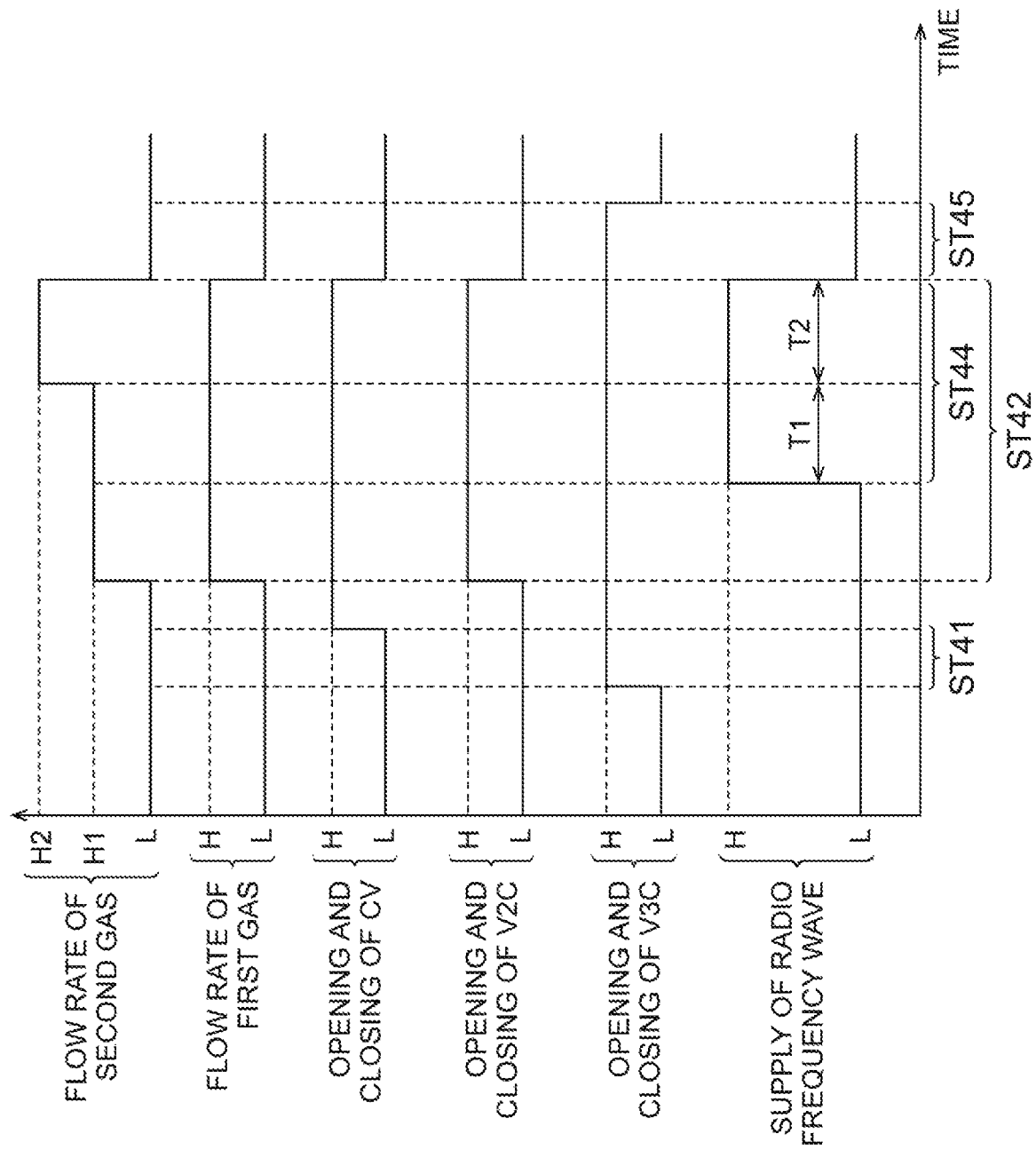
FIG. 15 is a timing chart of a method of etching a porous film according to a fourth embodiment.

Hereinafter, a method of etching a porous film of the fourth embodiment will be described. FIG. 15 is a timing chart of the method of etching a porous film according to the fourth embodiment. In FIG. 15, the horizontal axis indicates the time. The vertical axis indicates the flow rate of the second gas, the flow rate of the first gas, opening and closing of the control valve CV, opening and closing of the on-off valve V2C, opening and closing of the on-off valve V3C, and supply of a radio frequency wave. In the timing chart related to the flow rate of the second gas in FIG. 15, the levels of "H1" and "H2" indicate that the second gas is supplied to the chamber 12c. The flow rate of the second gas indicated by "H2" is greater than the flow rate indicated by "H1", and the level of "L" indicates that the second gas is not supplied to the chamber 12c. In the timing chart related to the flow rate of the first gas in FIG. 15, the level of "L" indicates that the first gas is not supplied to the chamber 12c, and the level of "H" indicates that the first gas is supplied to the chamber 12c. In the timing chart related to opening and closing of the control valve CV in FIG. 15, the level of "L" indicates that the control valve CV is closed, and the level of "H" indicates that the control valve CV is opened. In the timing chart related to opening and closing of the on-off valve V2C in FIG. 15, the level of "H" indicates that the on-off valve V2C is opened, and the level of "L" indicates that the on-off valve V2C is closed. In the timing chart related to opening and closing of the on-off valve V3C in FIG. 15, the level of "H" indicates that the on-off valve V3C is opened, and the level of "L" indicates that the on-off valve V3C is closed. In the timing chart related to supply of a radio frequency wave in FIG. 15, the level of "H" indicates that the first radio frequency wave and the second radio frequency wave are supplied, and the level of "L" indicates that the first radio frequency wave and the second radio frequency wave are stopped being supplied.

In the method of the fourth embodiment, in Step ST41, gas in the flow passage L2C is discharged. During execution of Step ST41, the control valve CV and the on-off valve V2C are closed, and the on-off valve V3C is opened. Accordingly, the flow passage L2C is connected to the gas discharging apparatus via the flow passage L3C, and a gas in the flow passage L2C is discharged by the gas discharging apparatus. The on-off valve V3C is continuously opened from the start time point of execution of Step ST41 to the end time point of execution of Step ST45, which will be described later.

In the method of the fourth embodiment, after Step ST41 is executed and before Step ST42 is executed, the control valve CV is opened. The control valve CV is opened until the start time point of execution of Step ST45.

In the succeeding Step ST42, the first gas is supplied to the chamber 12c such that capillary condensation thereof is caused in the porous film PL. In Step ST42, the on-off valve V2C is opened. Accordingly, the first gas is supplied to the chamber 12c via the flow passage L2C and the flow passage L1C. In the method of the fourth embodiment, the second gas is continuously supplied to the chamber 12c from the start time point of Step ST42 to the start time point of Step ST45. That is, throughout Steps ST42 and ST44, a mixed gas of the first gas and the second gas is supplied to the chamber 12c. In Step ST42, the temperature of the workpiece W and the partial pressure of the first gas are set to the temperature and the partial pressure same as the temperature of the workpiece W and the partial pressure of the first gas in Step ST12.

In Step ST44, plasma of the mixed gas of the first gas and the second gas is generated. Step ST44 starts from the time point between the start time point and the end time point of the execution period of Step ST42 and continues until the end time point of Step ST42. In Step ST44, the first radio frequency wave is supplied to the upper electrode 30 (or the lower electrode 18), and the second radio frequency wave is supplied to the lower electrode 18. One of the first radio frequency wave and the second radio frequency wave does not have to be supplied. In Step ST44, the pressure of the chamber 12c and the temperature of the workpiece W are set the temperature and the partial pressure same as the pressure of the chamber 12c and the temperature of the workpiece W in Step ST14.

Step ST44 and Step ST42 which is executed in an overlapping manner during the execution period of Step ST44 may be repeated. During the execution period of each Step ST44 in the repetition, the flow rate of the second gas is increased gradually by the flow rate controller FC1C. Specifically, the execution period of each Step ST44 in the repetition includes a time period T1 and a time period T2 succeeding the time period T1. The flow rate of the second gas in the time period T2 is greater than the flow rate of the second gas in the time period T1.

In the succeeding Step ST45, a gas in the flow passage L2C is discharged. During execution of Step ST45, the control valve CV and the on-off valve V2C are closed, and the on-off valve V3C is opened. In the method of the fourth embodiment, subsequently, the workpiece W is heated by the heat treatment apparatus. Accordingly, the liquid in the porous film PL is vaporized, and the generated gas is discharged.

In the method of the fourth embodiment, in Step ST42, liquid is generated in the porous film PL. In addition, even while the porous film PL is etched in Step ST44, the liquid based on the first gas is supplemented to the porous film PL. According to the method of the fourth embodiment, the porous film PL can be etched while the porous film PL is protected by the liquid based on the first gas. In addition, in accordance with execution of Steps ST41 and ST45, the first gas is restrained from being liquefied in the flow passage L2C. Moreover, during execution of Steps ST42 and ST44, the pressure of the first gas in the flow passage L2C is adjusted by the gas discharging apparatus. Accordingly, the first gas is restrained from being liquefied in the flow passage L2C.

The methods of the first to fourth embodiments may be performed by using the plasma processing apparatus 10A having the gas supply system 100A or the gas supply system 100B. In a case of using the gas supply system 100A when the methods of the first to fourth embodiments are executed, the on-off valve V21A, the on-off valve V22A, and the on-off valve V23A are used in place of the on-off valve V2C, the on-off valve V3A is used in place of the on-off valve V3C, and the flow rate controller FC2A and the on-off valve V2A are used in place of the control valve CV. In a case of using the gas supply system 100B when the methods of the first to fourth embodiments are executed, the on-off valve V22B is used in place of the on-off valve V2C, the on-off valve V3B is used in place of the on-off valve V3C, and the flow rate controller FC2B and the on-off valve V21B are used in place of the control valve CV.

Hereinbefore, various types of the embodiments have been described. However, various modifications may be made without being limited to the above-described embodiments. For example, the plasma processing apparatus of the above-described embodiments is a capacitive coupling-type plasma processing apparatus. However, a plasma processing apparatus in a modification may be an arbitrary type plasma processing apparatus such as an inductive coupling-type plasma processing apparatus and a plasma processing apparatus using surface waves such as microwaves.

REFERENCE SIGNS LIST

1: processing system, TF: transfer module, TC: transfer chamber, MC: controller, 10Aa and 10C: plasma processing apparatus, 12: chamber body, 12c: chamber, 16: stage, 18: lower electrode, 18f: flow channel, 20: electrostatic chuck, 30: upper electrode, 50: gas discharging apparatus, 62: first radio frequency power source, 64: second radio frequency power source, HTC: heater, 100A: gas supply system, GS1 and GS2: gas source, L1A, L11A, L12A, and L13A: flow passage (first flow passage), L2A, L21A, L22A, and L23A: flow passage (second flow passage), L3A: flow passage (third flow passage), V21A, V22A and V23A: on-off valve (first on-off valve), V3A: on-off valve (second on-off valve), HJA: heater, 100B: gas supply system, L1B, L11B, L12B, and L13B: flow passage (first flow passage), L2B: flow passage (second flow passage), L3B: flow passage (third flow passage), V22B: on-off valve (first on-off valve), V3B: on-off valve (second on-off valve), HJB: heater, 100C: gas supply system, L1C: flow passage (first flow passage), L2C: flow passage (second flow passage), L3C: flow passage (third flow passage), CV: control valve, V2C: on-off valve (first on-off valve), V3C: on-off valve (second on-off valve), OL1: orifice member, OL2: orifice member, HJC: heater, W: workpiece, MK: mask, PL: porous film

The invention claimed is:

1. A plasma processing apparatus for etching a porous film, the apparatus comprising:
    a chamber body providing a chamber;
    a stage provided in the chamber, a flow channel for a refrigerant being formed in the stage;
    a gas supply system for supplying a first gas causing capillary condensation thereof in the porous film and a second gas for etching the porous film to the chamber; and
    a plasma generator for generating plasma of a gas supplied to the chamber, wherein
    the gas supply system provides
        a first flow passage connecting a second gas source to the chamber through a first connection point, the second gas source having the second gas,
        a second flow passage connecting a first gas source to the first flow passage at the first connection point, the first gas source having the first gas, and
        a third flow passage connecting a gas discharging apparatus to the second flow passage at a point along the second flow passage that is between the first gas source and the first connection point.

2. The plasma processing apparatus according to claim 1, wherein the gas supply system includes
    a control valve provided on the second flow passage,
    a first orifice member defining a terminal end of the second flow passage on a downstream side of the control valve, the first orifice member reducing a cross sectional area of the second flow passage at the terminal end of the second flow passage, and
    a first on-off valve configured to open and close the terminal end of the second flow passage with respect to the first flow passage, the first on-off valve provided at a connection spot between the first flow passage and the second flow passage.

3. The plasma processing apparatus according to claim 2, wherein the gas supply system further includes
    a second orifice member defining the third flow passage partially, the second orifice member reducing a cross sectional area of the third flow passage, and
    a second on-off valve provided on the third flow passage between the second orifice member and the gas discharging apparatus.

4. The plasma processing apparatus according to claim 1, wherein the gas supply system includes
    a first on-off valve provided on the second flow passage, and
    a second on-off valve provided on the third flow passage.

5. The plasma processing apparatus according to claim 1, further comprising
    a heater for heating a pipe which provides the first flow passage, the second flow passage, and the third flow passage.

6. The plasma processing apparatus according to claim 1, further comprising
    a heater for heating the chamber body.

7. A processing system comprising:
    the plasma processing apparatus according to claim 1;
    a transfer module providing a transfer chamber capable of being depressurized and capable of being connected to the chamber of the plasma processing apparatus and having a transfer apparatus, provided in the transfer chamber, for transferring a workpiece; and
    a heat treatment apparatus providing an other chamber capable of being connected to the transfer chamber and configured to heat a workpiece in the other chamber.

8. A method of etching a porous film by using the plasma processing apparatus according to claim 1, which is performed in a state where a workpiece having the porous film and a mask provided on the porous film and providing an opening exposing the porous film partially is placed on a stage provided in the chamber of the plasma processing apparatus, the method comprising:
    supplying the first gas to the chamber such that capillary condensation of the first gas is caused in the porous film, wherein partial pressure of the first gas in the chamber or pressure of the first gas in the chamber when only the first gas is supplied to the chamber is higher than critical pressure causing capillary condensation of the first gas in the porous film and lower than saturated vapor pressure of the first gas; and
    generating plasma of the second gas in the chamber of the plasma processing apparatus to etch the porous film.

9. The method according to claim 8, further comprising:
    discharging a gas in the second flow passage by using the gas discharging apparatus, before said supplying the first gas is performed.

10. The method according to claim 9, wherein
    an on-off valve which is provided between the first flow passage and the second flow passage or on the second flow passage is closed, when said discharging a gas in the second flow passage is performed.

11. The method according to claim 8, further comprising:
    discharging a gas in the second flow passage by using the gas discharging apparatus, after said generating plasma of the second gas is performed.

12. The method according to claim 11, wherein
    an on-off valve which is provided between the first flow passage and the second flow passage or on the second flow passage is closed, when said discharging a gas in the second flow passage is performed.

13. The method according to claim 8, wherein
    said supplying the first gas and said generating plasma of the second gas are alternately repeated.

14. The method according to claim 13, wherein
    in said generating plasma of the second gas, the first gas is stopped being supplied to the chamber.

15. The method according to claim 14, wherein
    during alternative repetition of said supplying the first gas and said generating plasma of the second gas, a flow rate of the first gas is reduced gradually.

16. The method according to claim 13, wherein
during said supplying the first gas and said generating plasma of the second gas, the first gas and the second gas are supplied to the chamber.

17. The method according to claim 16, wherein
in said generating plasma of the second gas, a flow rate of the second gas supplied to the chamber is increased gradually.

18. The plasma processing apparatus according to claim 1, wherein
the first gas source has the first gas including at least one selected from a group consisting of a fluorocarbon gas, an oxygen-containing fluorocarbon gas, a hydrocarbon gas, and an oxygen-containing hydrocarbon gas, and
the second gas source has the second gas including a fluorine-containing gas.

19. The plasma processing apparatus according to claim 1, wherein
the chamber includes an upper electrode,
the upper electrode includes an electrode plate and a support,
the support includes one or more gas diffusion chambers, and
the first flow passage is connected to the one or more gas diffusion chambers.

20. The plasma processing apparatus according to claim 19, wherein
the support includes a plurality of gas diffusion chambers as the one or more gas diffusion chambers, and
the first flow passage is connected to the plurality of gas diffusion chambers via a flow splitter.

* * * * *